(12) United States Patent
Kiyotoshi

(10) Patent No.: US 8,435,857 B2
(45) Date of Patent: May 7, 2013

(54) METHOD FOR MANUFACTURING SEMICONDUCTOR MEMORY DEVICE

(75) Inventor: Masahiro Kiyotoshi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/218,868

(22) Filed: Aug. 26, 2011

(65) Prior Publication Data

US 2012/0184078 A1    Jul. 19, 2012

(30) Foreign Application Priority Data

Jan. 17, 2011  (JP) ................................. 2011-007323

(51) Int. Cl.
*H01L 21/8247* (2006.01)
(52) U.S. Cl.
USPC .................................. 438/261; 257/E21.561
(58) Field of Classification Search .......... 438/257–267; 257/E21.561
See application file for complete search history.

(56) References Cited

U.S. PATENT DOCUMENTS

| | | | |
|---|---|---|---|
| 6,531,350 B2 * | 3/2003 | Satoh et al. | 438/197 |
| 6,707,079 B2 * | 3/2004 | Satoh et al. | 257/288 |
| 2008/0073635 A1 | 3/2008 | Kiyotoshi et al. | |
| 2009/0121271 A1 | 5/2009 | Son et al. | |
| 2010/0315875 A1 | 12/2010 | Kim et al. | |
| 2011/0049611 A1 | 3/2011 | Kiyotoshi et al. | |
| 2011/0156132 A1 | 6/2011 | Kiyotoshi | |

FOREIGN PATENT DOCUMENTS

| | | |
|---|---|---|
| JP | 2009-146954 | 7/2009 |
| KR | 10-2010-0063634 | 6/2010 |
| WO | WO 2010/143306 A1 | 12/2010 |

OTHER PUBLICATIONS

U.S. Appl. No. 12/532,030, filed Sep. 18, 2009, Masahiro Kiyotoshi.
U.S. Appl. No. 13/316,603, filed Dec. 12, 2011, Sakuma et al.
U.S. Appl. No. 13/352,693, Jan. 18, 2012, Kiyotoshi.
Office Action mailed Dec. 14, 2012, in Korean Patent Application No. 10-2011-87105, pp. 1-8. (w/English Translation).

* cited by examiner

*Primary Examiner* — Richard A. Booth
(74) *Attorney, Agent, or Firm* — Oblon, Spivak, McClelland, Maier & Neustadt, L.L.P.

(57) ABSTRACT

According to one embodiment, a method for manufacturing a semiconductor memory device, includes forming a stacked body on a substrate by alternately stacking a first insulating film and a second insulating film, making a through-hole extending in a stacking direction of the first insulating film and the second insulating film to pierce the stacked body, forming at least a portion of a blocking insulating film, a charge trap film, and a tunneling dielectric film of a MONOS on an inner surface of the through-hole, forming a channel semiconductor on the tunneling dielectric film, making a trench in the stacked body, removing the second insulating film by performing etching via the trench, and filling a conductive material into a space made by the removing of the second insulating film.

13 Claims, 31 Drawing Sheets

FIG. 31

| STEP | S1 | S2 | S3 | S4 | S5 | S6 | S7 | S8 | S9 |
|---|---|---|---|---|---|---|---|---|---|
| CONTENT | FORM TRANSISTOR | FORM PMD | FORM ILD | MAKE THROUGH-HOLE | FILL MATERIAL | MAKE TRENCH | REMOVE SACRIFICIAL FILM | FORM DIELECTRIC FILM | FORM ELECTRODE |
| EMBODIMENT | PERIPHERAL CIRCUIT | | | | | | | | |
| COMPARATIVE EXAMPLE (DRAM) | CELL CIRCUIT | | | | | ⇑ | | | |

US 8,435,857 B2

METHOD FOR MANUFACTURING SEMICONDUCTOR MEMORY DEVICE

CROSS-REFERENCE TO RELATED APPLICATIONS

This application is based upon and claims the benefit of priority from the prior Japanese Patent Application No. 2011-007323, filed on Jan. 17, 2011; the entire contents of which are incorporated herein by reference.

FIELD

Embodiments described herein relate generally to a method for manufacturing a semiconductor memory device.

BACKGROUND

In the field of NAND flash memory in recent years, stacked memory has been drawing attention as a device capable of achieving higher bit densities without being constrained by limitations of the resolution of lithography technology. For example, a semiconductor memory device has been proposed in which multiple electrode films and multiple insulating films having flat plate configurations are alternately stacked, semiconductor members extending in the stacking direction pierce the electrode films and the insulating films, and insulative charge storage layers are provided between the electrode films and the semiconductor members. However, although it is necessary to make through-holes in the stacked body made of the electrode films and the insulating films to fill the semiconductor members when manufacturing such a semiconductor memory device, it is unfortunately difficult to make such through-holes.

BRIEF DESCRIPTION OF THE DRAWINGS

FIG. 31 schematically illustrates the manufacturing processes of the semiconductor memory device according to the third embodiment and general manufacturing processes of a DRAM.

DETAILED DESCRIPTION

In general, according to one embodiment, a method for manufacturing a semiconductor memory device, includes forming a stacked body on a substrate by alternately stacking a first insulating film and a second insulating film, making a through-hole extending in a stacking direction of the first insulating film and the second insulating film to pierce the stacked body, forming at least a portion of a blocking insulating film, a charge trap film, and a tunneling dielectric film of a MONOS on an inner surface of the through-hole, forming a channel semiconductor on the tunneling dielectric film, making a trench in the stacked body, removing the second insulating film by performing etching via the trench, and filling a conductive material into a space made by the removing of the second insulating film.

In general, according to another embodiment, a method for manufacturing a semiconductor memory device, includes forming a stacked body on a substrate by alternately stacking a first insulating film and a second insulating film, making a through-hole extending in a stacking direction of the first insulating film and the second insulating film to pierce the stacked body, forming a tunneling dielectric film on an inner surface of the through-hole, forming a channel semiconductor on the tunneling dielectric film, making a trench in the stacked body, removing the second insulating film by performing etching via the trench, depositing a charge trap film and a charge blocking film in this order on an inner surface of a space made by the removing of the second insulating film, and filling a conductive material into the space.

Embodiments of the invention will now be described with reference to the drawings.

First, a first embodiment will be described.

The embodiment is an example in which a NOMOS structure is formed to form stacked memory cells by alternately stacking a NSG (Non-doped silicate glass) film used to form an inter-electrode insulating film with a BSG (Boron-doped silicate glass) film used to form a sacrificial insulating film, stacking a boron-doped polycrystalline silicon film used to form a selection gate electrode thereon, and subsequently performing collective patterning.

FIG. 1 to FIG. 7 are cross-sectional views of processes that illustrate a method for manufacturing a semiconductor memory device according to the embodiment and illustrate three mutually orthogonal cross sections.

Figure 8:
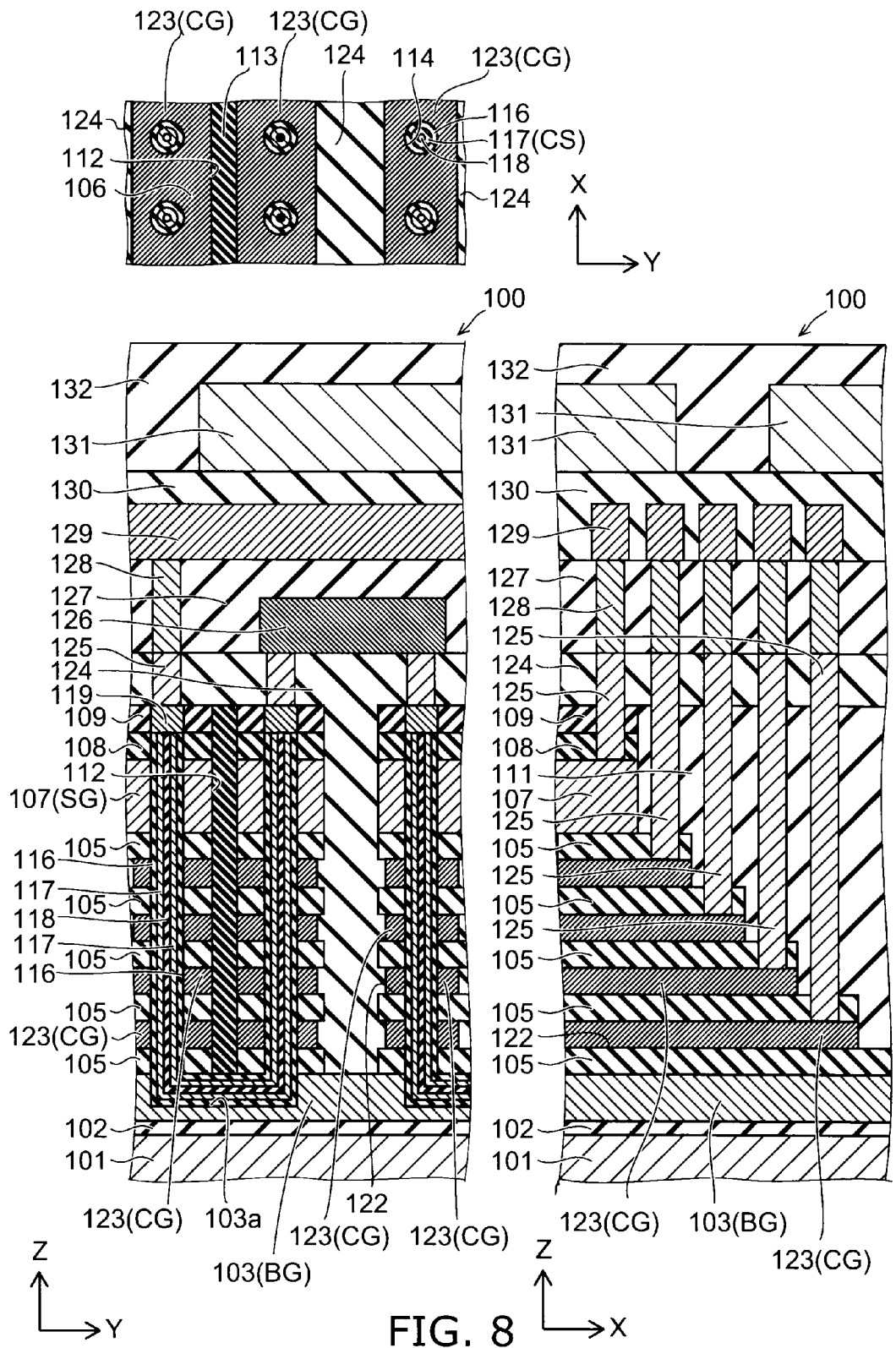
FIG. 8 is a cross-sectional view that illustrates the semiconductor memory device according to the first embodiment.

FIG. 8 is a cross-sectional view that illustrates the semiconductor memory device according to the embodiment and illustrates three mutually orthogonal cross sections.

Figure 9:
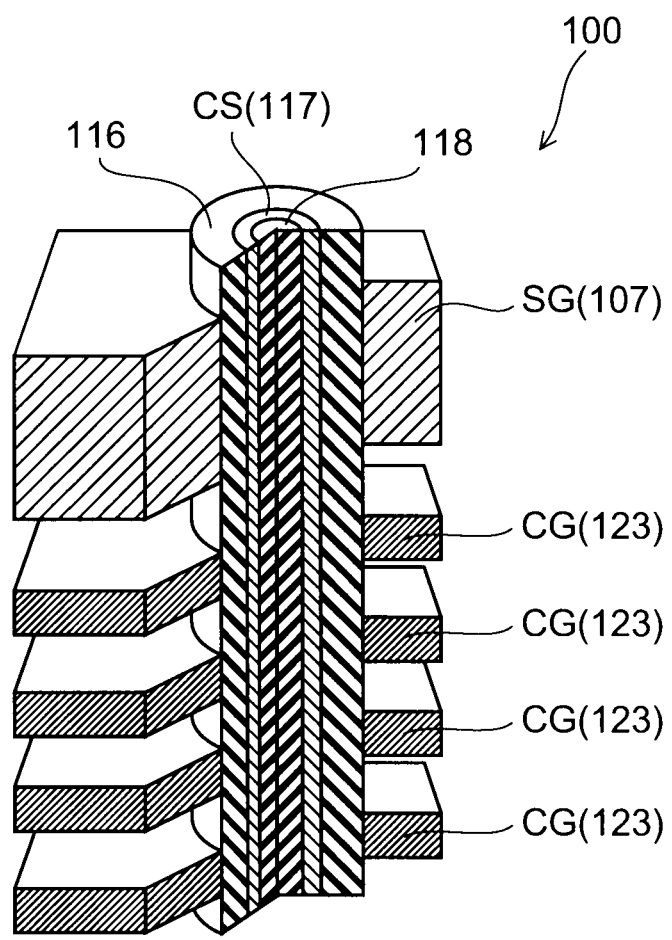
FIG. 9 is a perspective view illustrating a memory cell periphery of the semiconductor memory device according to the first embodiment.

FIG. 9 is a perspective view illustrating the memory cell periphery of the semiconductor memory device according to the embodiment.

Figure 10:
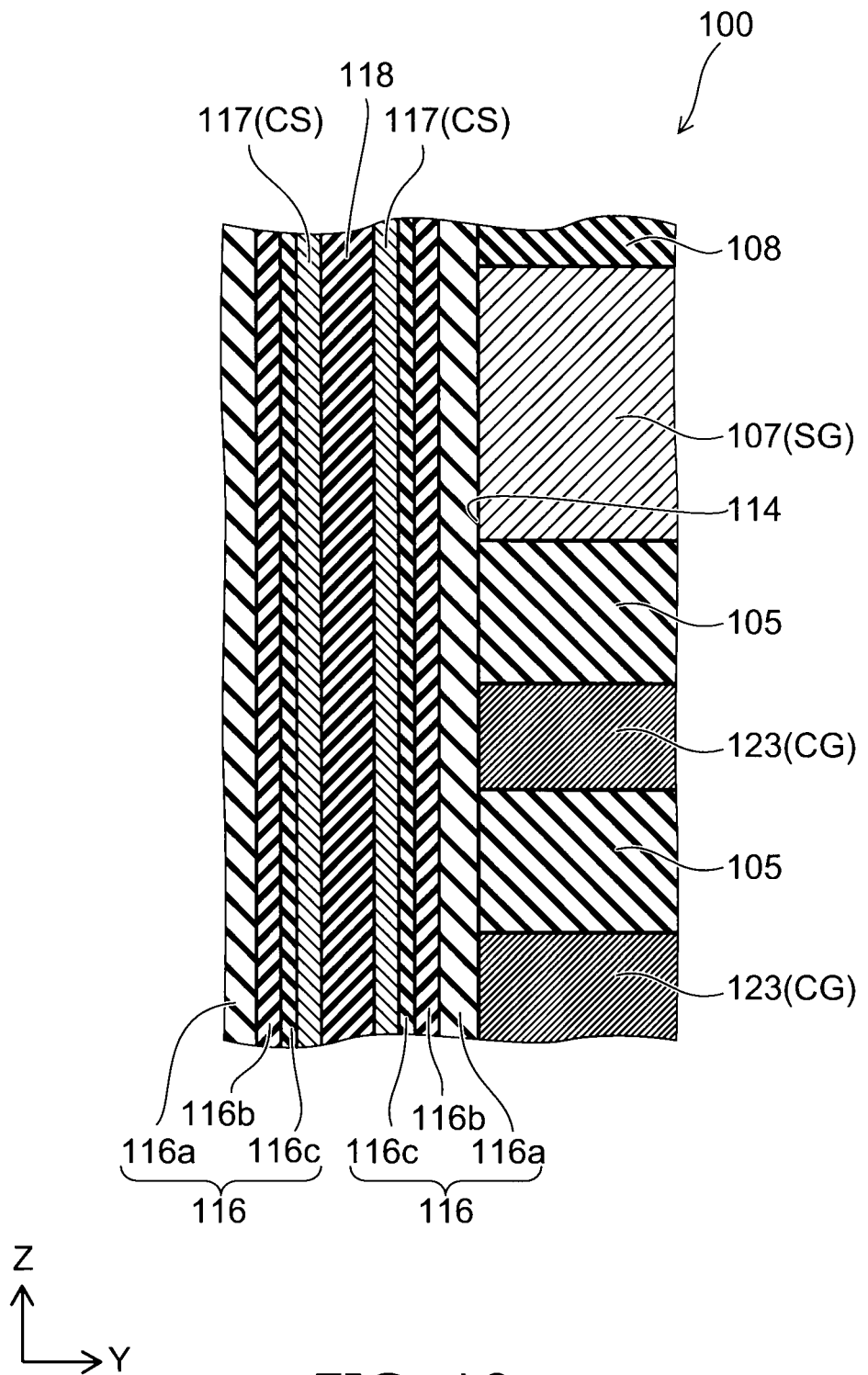
FIG. 10 is a cross-sectional view illustrating the memory cell periphery of the semiconductor memory device according to the first embodiment.

FIG. 10 is a cross-sectional view illustrating the memory cell periphery of the semiconductor memory device according to the embodiment.

Figure 1:
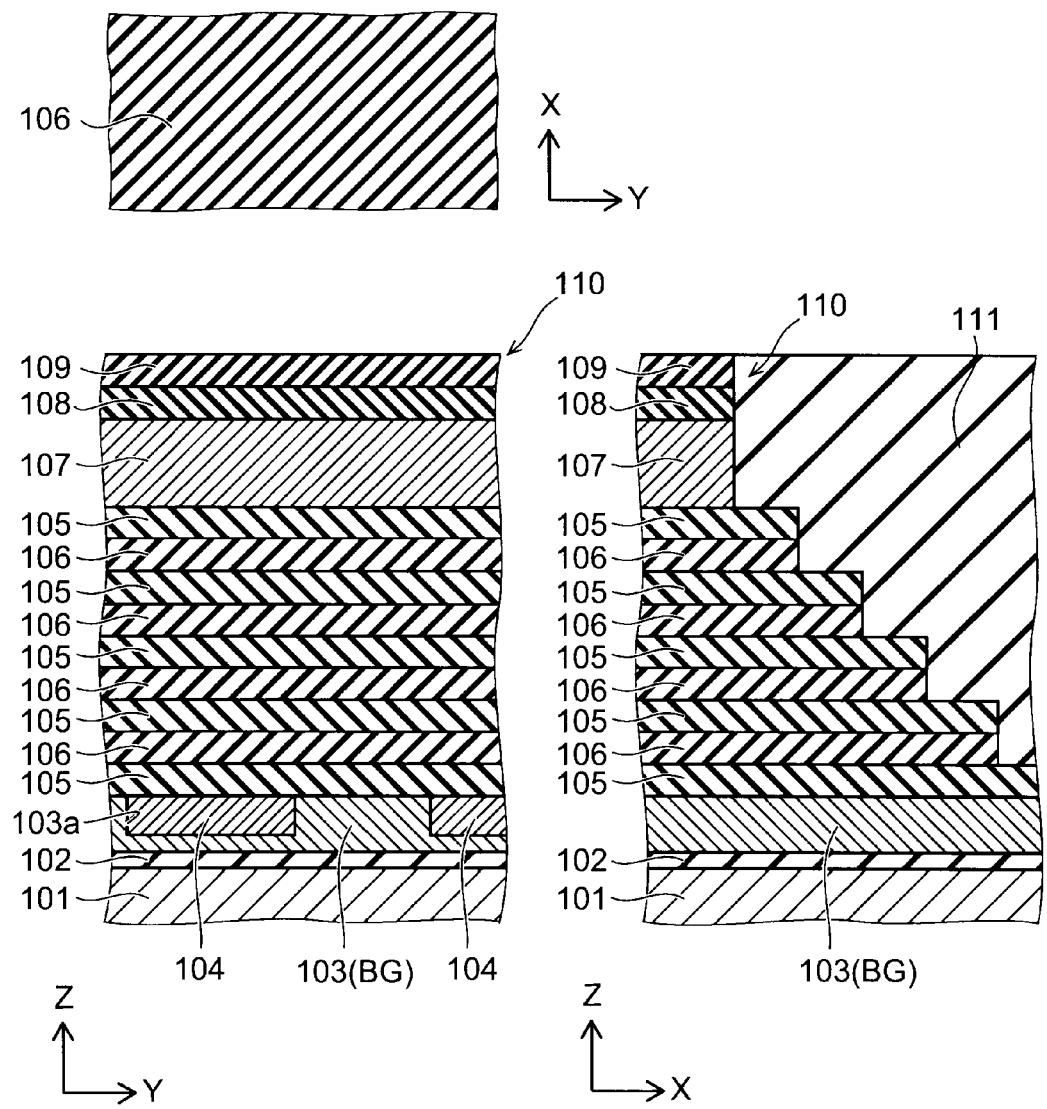
FIG. 1 to FIG. 7 are cross-sectional views of processes that illustrate a method for manufacturing a semiconductor memory device according to a first embodiment.

As illustrated in FIG. 1, a silicon substrate 101 is prepared. A memory cell unit where the memory cells are formed and a peripheral circuit unit where the peripheral circuit configured to drive the memory cells is formed are set in the silicon substrate 101. An XYZ orthogonal coordinate system is employed for convenience of description in the specification. Two mutually orthogonal directions parallel to the upper surface of the silicon substrate 101 are taken as an X direction and a Y direction. A direction perpendicular to the upper surface of the silicon substrate 101 is taken as a Z direction.

In the peripheral circuit unit, the peripheral circuit (not illustrated) is formed by forming transistors, etc., in the upper surface of the silicon substrate 101. On the other hand, in the memory cell unit, a silicon oxide film 102 is formed on the silicon substrate 101; and a boron (B)-doped polycrystalline silicon film 103 is formed thereon. Then, a back gate electrode BG is formed by patterning the boron-doped polycrystalline silicon film 103 using lithography and RIE (reactive ion etching). Then, an excavation 103a is made in a rectangular configuration extending in the Y direction in the upper surface of the boron-doped polycrystalline silicon film 103 using lithography and RIE. Then, an amorphous silicon film 104 is deposited on the entire surface and caused to recede to remain only inside the excavation 103a.

Then, a NSG film 105 made of non-doped silicon oxide is alternately deposited with a BSG film 106 made of boron-doped silicon oxide on the entire surface using CVD (chemical vapor deposition). The NSG film 105 is a film used to form the inter-electrode insulating film in the semiconductor memory device after completion; and the BSG film 106 is a sacrificial insulating film removed in a subsequent process. The NSG film 105 and the BSG film 106 are formed alternately one layer at a time such that the uppermost layer is the NSG film 105. For example, in the embodiment, five layers of the NSG film 105 and four layers of the BSG film 106 are deposited.

Continuing, a boron-doped polycrystalline silicon film 107, a silicon oxide film 108, and a silicon nitride film 109 are formed in this order. The boron-doped polycrystalline silicon film 107 is a film used to form a selection gate electrode SG in the semiconductor memory device after completion. Thereby, a stacked body 110 made of the NSG films 105, the BSG films 106, the boron-doped polycrystalline silicon film 107, the silicon oxide film 108, and the silicon nitride film 109 is formed on the boron-doped polycrystalline silicon film 103, i.e., the back gate electrode BG.

Then, a resist pattern (not illustrated) is formed on the stacked body 110 to cover the memory cell unit; and the stacked body 110 is patterned into a stairstep configuration at the end portion of the memory cell unit by repeatedly executing RIE using the resist pattern as a mask and slimming the resist pattern. At this time, the upper surface of the NSG film 105 is exposed at each of the levels of the stairstep. Subsequently, the stacked body 110 is buried by depositing a NSG film 111 on the entire surface. Then, the silicon nitride film 109 is exposed by planarizing the upper surface of the NSG film 111.

Figure 2:
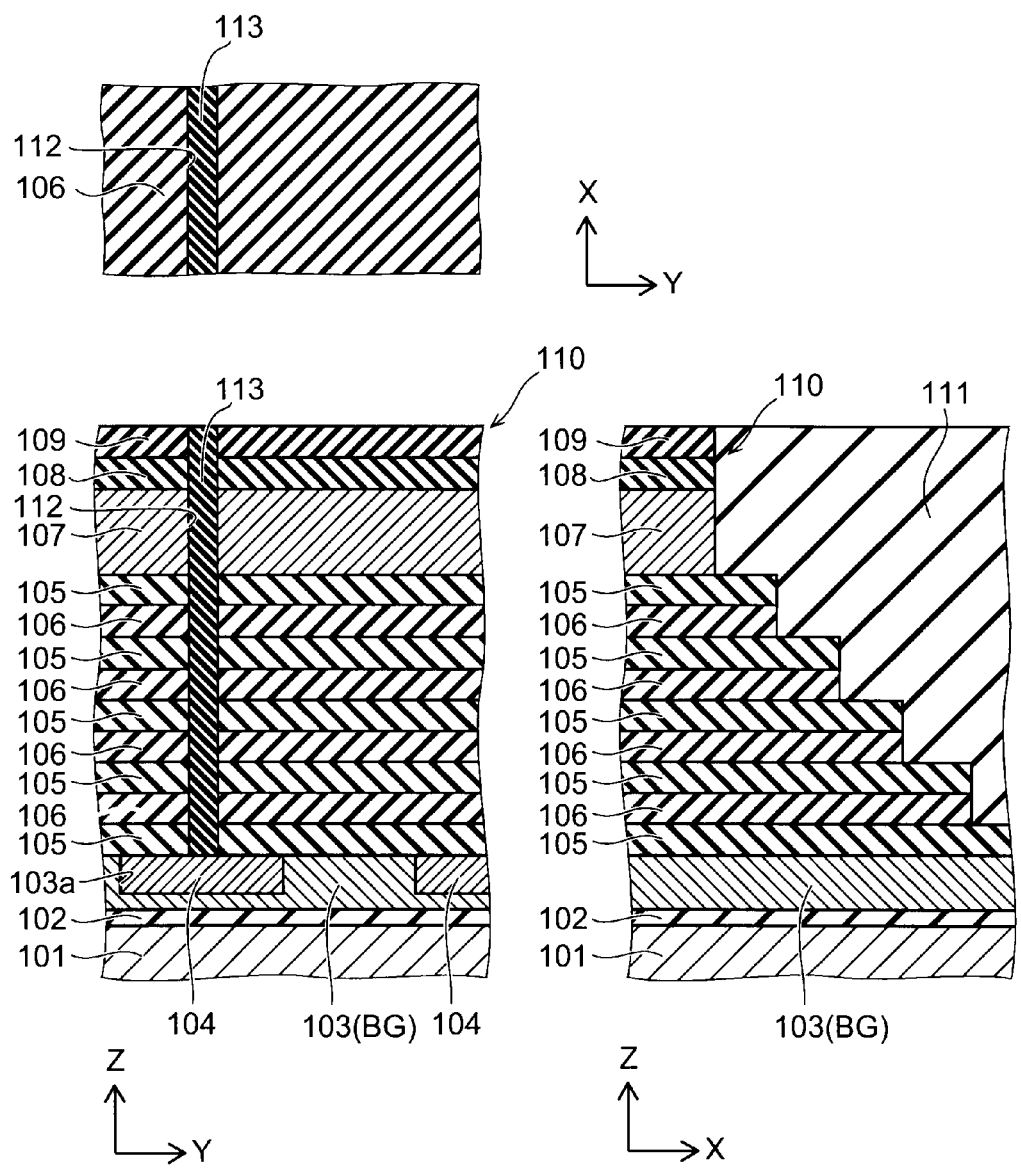

Continuing as illustrated in FIG. 2, a carbon film (not illustrated) is formed on the entire surface using PECVD (plasma enhanced CVD); and the carbon film is patterned using lithography and RIE. The carbon film is formed of carbon including hydrogen. Then, a trench 112 is made by selectively removing the stacked body 110 by performing RIE using the carbon film as a mask. The trench 112 extends in the X direction and is made to pass through the region directly above the longitudinal-direction central portion (Y-direction central portion) of the excavation 103a of the boron-doped polycrystalline silicon film 103. Then, silicon oxide is deposited on the entire surface; and the upper surface is planarized. Thereby, a silicon oxide member 113 is filled into the trench 112 by the silicon oxide remaining inside the trench 112. Subsequently, the carbon film is removed.

Figure 3:
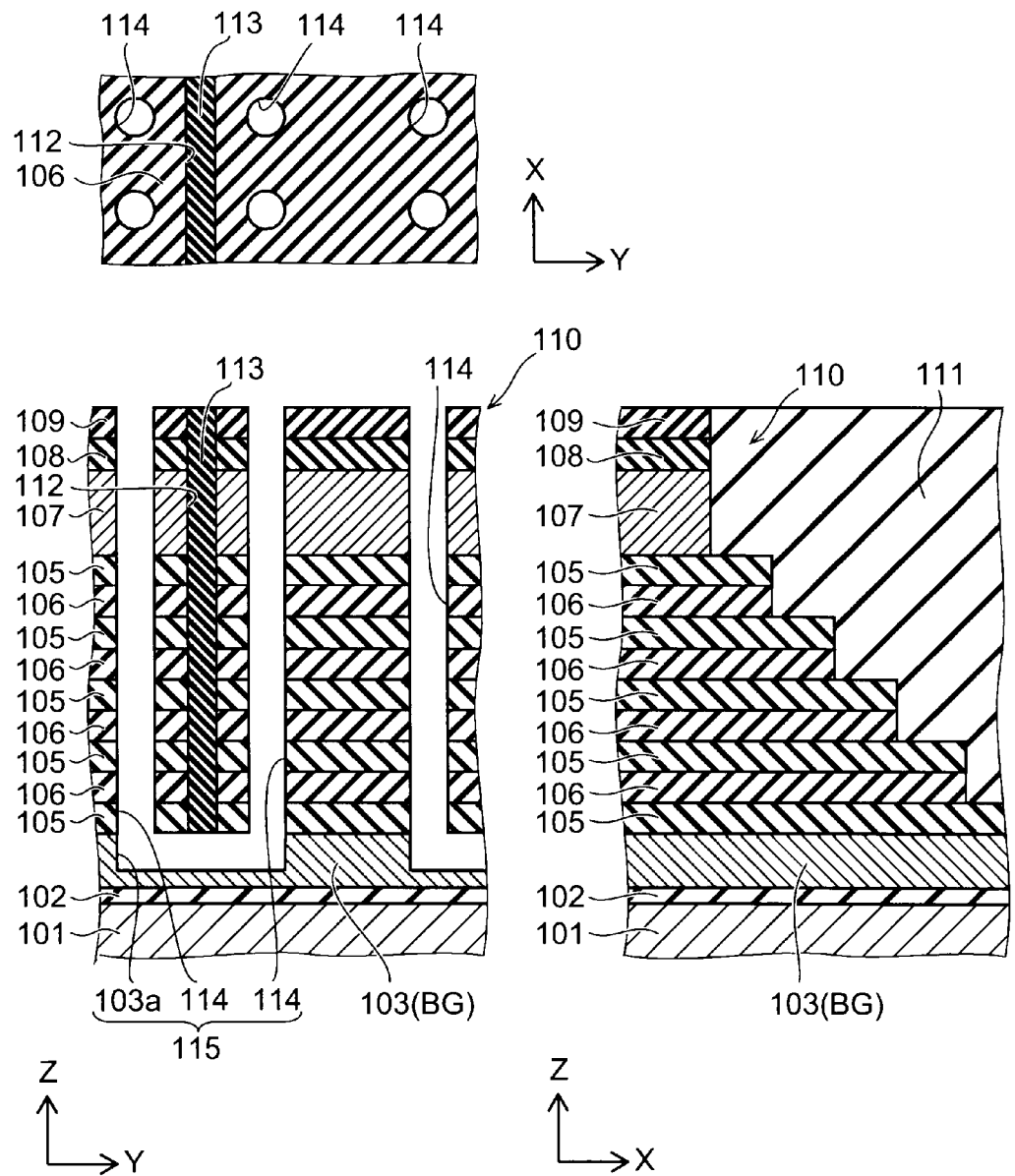

Then, as illustrated in FIG. 3, a carbon film (not illustrated) is formed on the entire surface using PECVD; and patterning is performed using lithography and RIE. Then, the stacked body 110 is selectively removed by performing RIE using the patterned carbon film as a mask. Thereby, a through-hole 114 extending in the Z direction is made in the stacked body 110. The through-holes 114 are arranged in a matrix configuration as viewed from the Z direction to reach both of the Y-direction end portions of the excavation 103a respectively. Then, the amorphous silicon film 104 (referring to FIG. 2) filled into the excavation 103a is removed via the through-hole 114 by performing wet etching using an ammonia/aqueous hydrogen peroxide solution. Thereby, a U-shaped hole 115 is made in which two of the through-holes 114 connect with one of the excavations 103a. Subsequently, the carbon film is removed.

Figure 4:
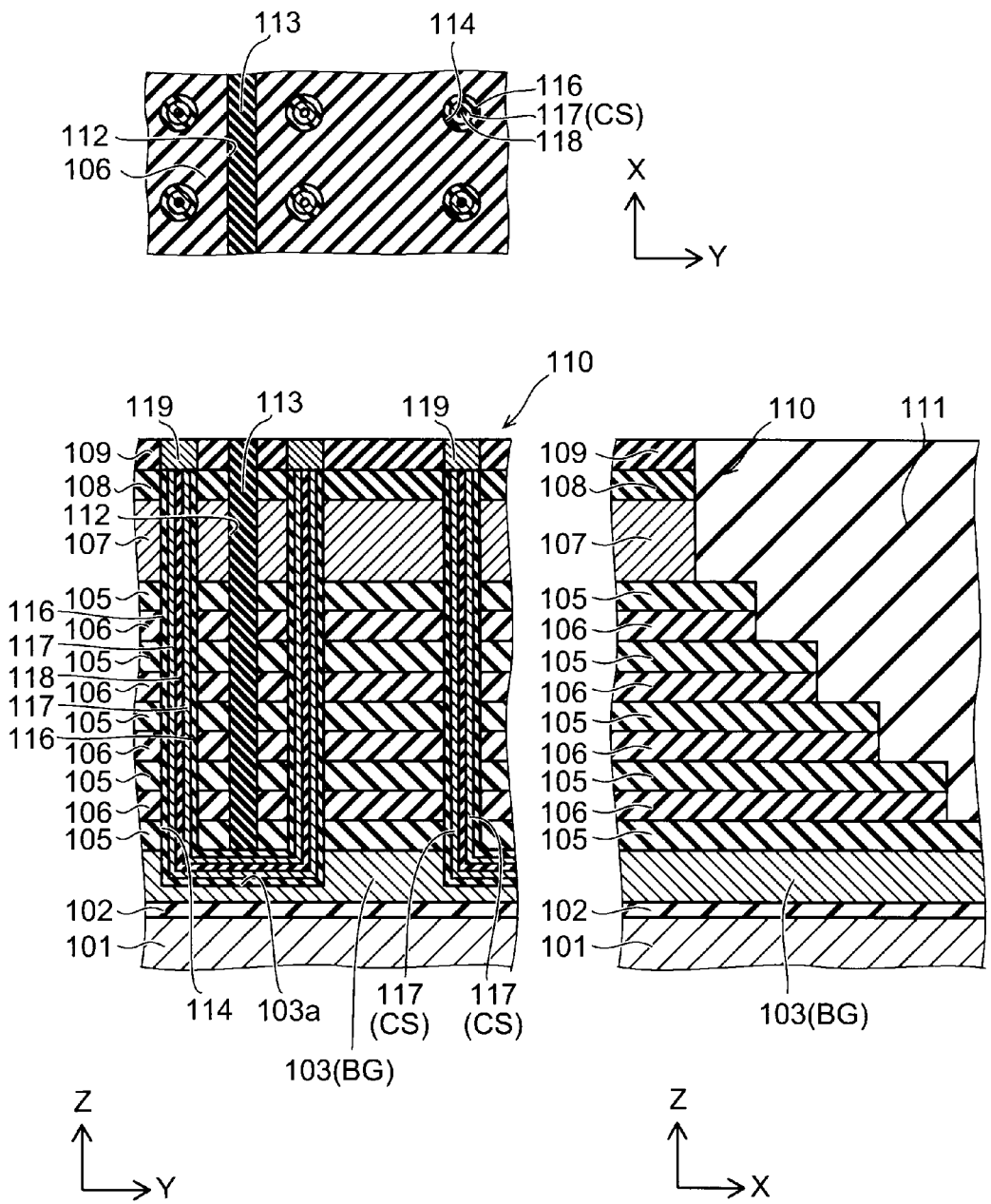

Continuing as illustrated in FIG. 4, a memory film 116 is formed by depositing a charge blocking film 116a, a charge trap film 116b, and a tunneling dielectric film 116c (referring to FIG. 10) in this order on the inner surface of the U-shaped hole 115 using ALD (atomic layer deposition) or LPCVD (low pressure chemical vapor deposition). The charge blocking film 116a is a film that substantially does not allow current to flow even in the case where a voltage within the range of the drive voltage of the semiconductor memory device is applied. The charge blocking film 116a is formed of a high dielectric constant material, e.g., a material having a dielectric constant higher than the dielectric constant of the material of the charge trap film 116b, by, for example, depositing alumina using ALD. The charge trap film 116b is a film capable of storing charge, e.g., a film including trap sites of electrons, formed by, for example, depositing silicon nitride using ALD. Although the tunneling dielectric film 116c normally is insulative, the tunneling dielectric film 116c is formed by, for example, depositing an ONO (oxide-nitride-oxide) film using ALD and is a film in which a tunneling current flows when a prescribed voltage within the range of the drive voltage of the semiconductor memory device is applied.

Then, a boron-doped polycrystalline silicon film 117 is formed on the memory film 116. The boron-doped polycrystalline silicon film 117 is a film used to form a channel semiconductor CS of the memory cells. At this time, the boron-doped polycrystalline silicon film 117 is deposited in a tubular configuration along the inner surface of the U-shaped hole 115. Thereby, the channel semiconductor CS is formed in a tubular configuration inside the U-shaped hole 115. Then, silicon oxide 118 is filled into the remaining portion inside the U-shaped hole 115, i.e., the space around which the boron-doped polycrystalline silicon film 117 having the tubular configuration is provided, by using, for example, ALD. Thereby, the charge blocking film 116a, the charge trap film 116b, the tunneling dielectric film 116c, the boron-doped polycrystalline silicon film 117 (the channel semiconductor CS), and the silicon oxide 118 are disposed inside the U-shaped hole 115 in order from the outside.

Continuing, a recess is made in the upper portion inside the U-shaped hole 115 by causing the memory film 116, the boron-doped polycrystalline silicon film 117, and the silicon oxide 118 formed inside the U-shaped hole 115 to recede by performing RIE. Then, a polycrystalline silicon member 119 is filled into the recess. Continuing, a source region (not illustrated) and a drain region (not illustrated) are formed by introducing arsenic (As) into the polycrystalline silicon member 119 using lithography and ion implantation.

Figure 5:
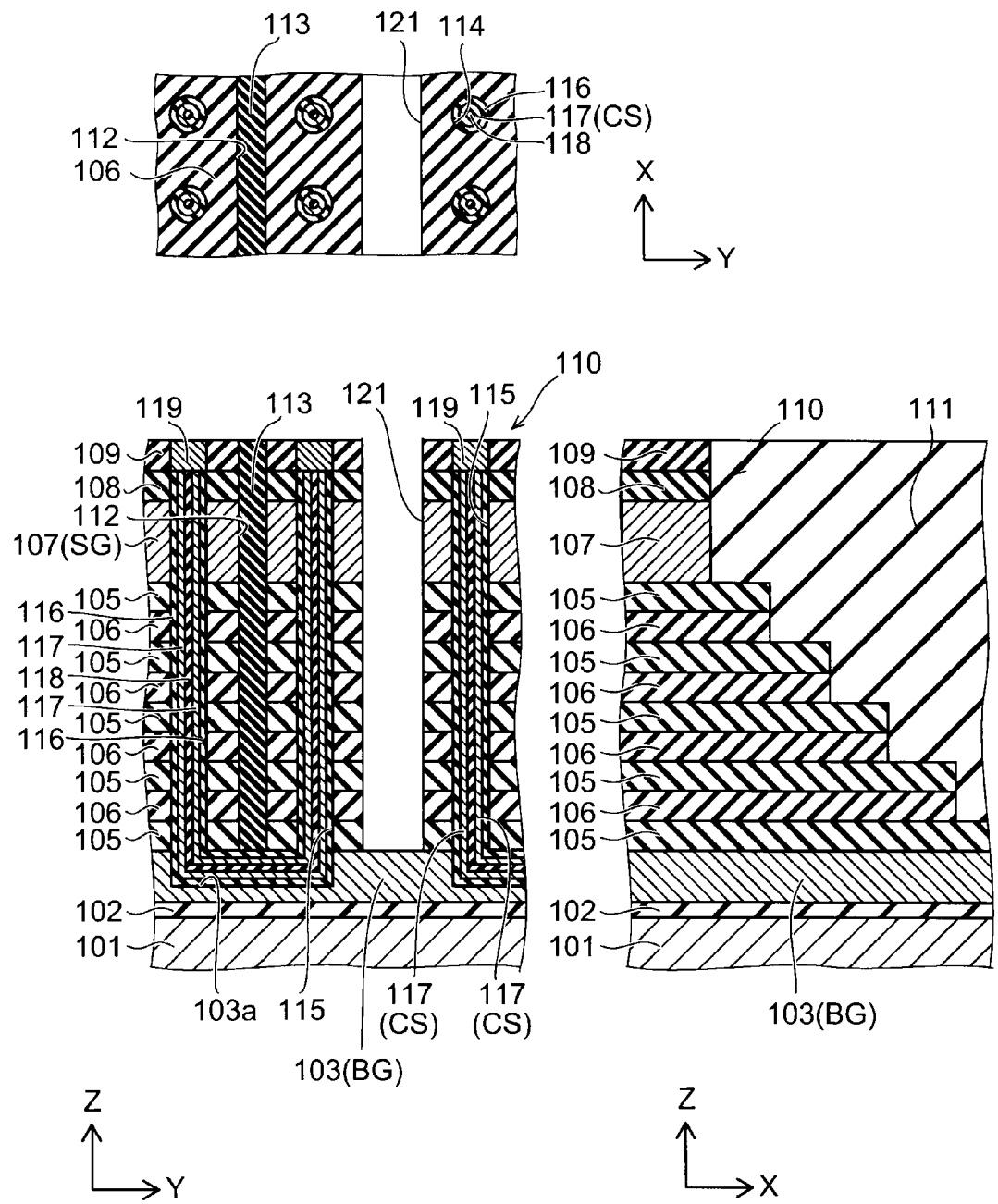

Then, as illustrated in FIG. 5, a carbon film (not illustrated) is formed on the entire surface using PECVD and patterned using lithography and RIE. Then, a trench 121 is made in the stacked body 110 by performing RIE using the patterned carbon film as a mask. The trench 121 is made in the stacked body 110 to extend in the X direction in the portion between the U-shaped holes 115 adjacent to each other in the Y direction to pierce the stacked body 110. Subsequently, the carbon film is removed. Thereby, all of the BSG films 106 are exposed at the inner surface of the trench 121. The stacked body 110 is subdivided into gate electrode configurations as viewed from the Z direction by the trenches 112 and 121. The boron-doped polycrystalline silicon film 107 becomes the selection gate electrodes SG by being subdivided by the trenches 112 and 121.

Figure 6:
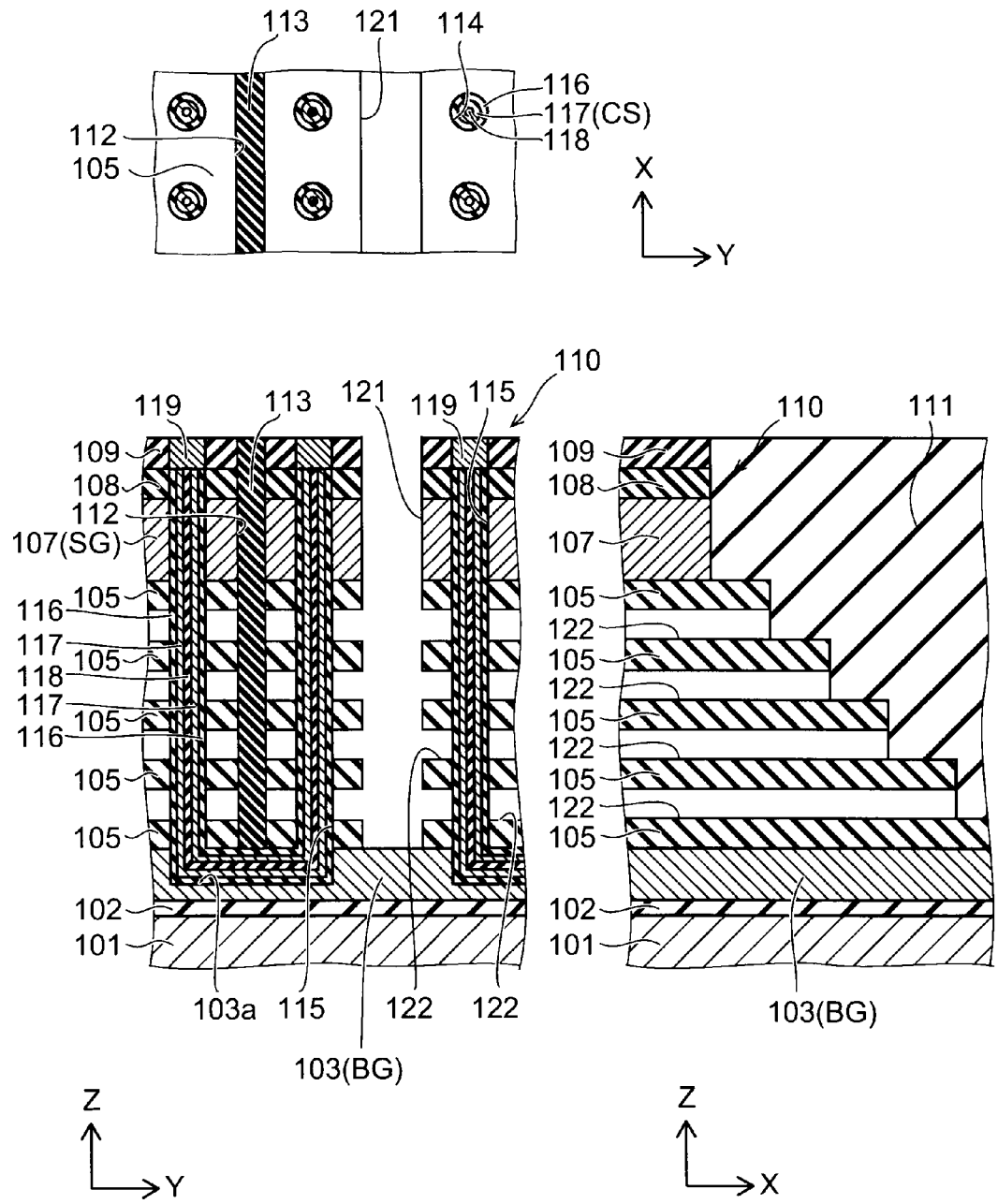

Continuing as illustrated in FIG. 6, wet etching is performed using hot phosphoric acid. Thereby, the BSG films 106 (referring to FIG. 5) are removed via the trench 121. At this time, the other films, e.g., the NSG films 105, the memory film 116, the silicon oxide member 113, etc., are substantially not removed. As a result, a cavity 122 forms in the portion where the BSG films 106 were formed. The cavity 122 is a space that forms a mold of the control gate electrodes in a subsequent process. At this time, the NSG films 105 are supported by the columnar structural body made of the memory film 116, the channel semiconductor CS, and the silicon oxide 118 and by the silicon oxide member 113 having the plate configuration.

Figure 7:
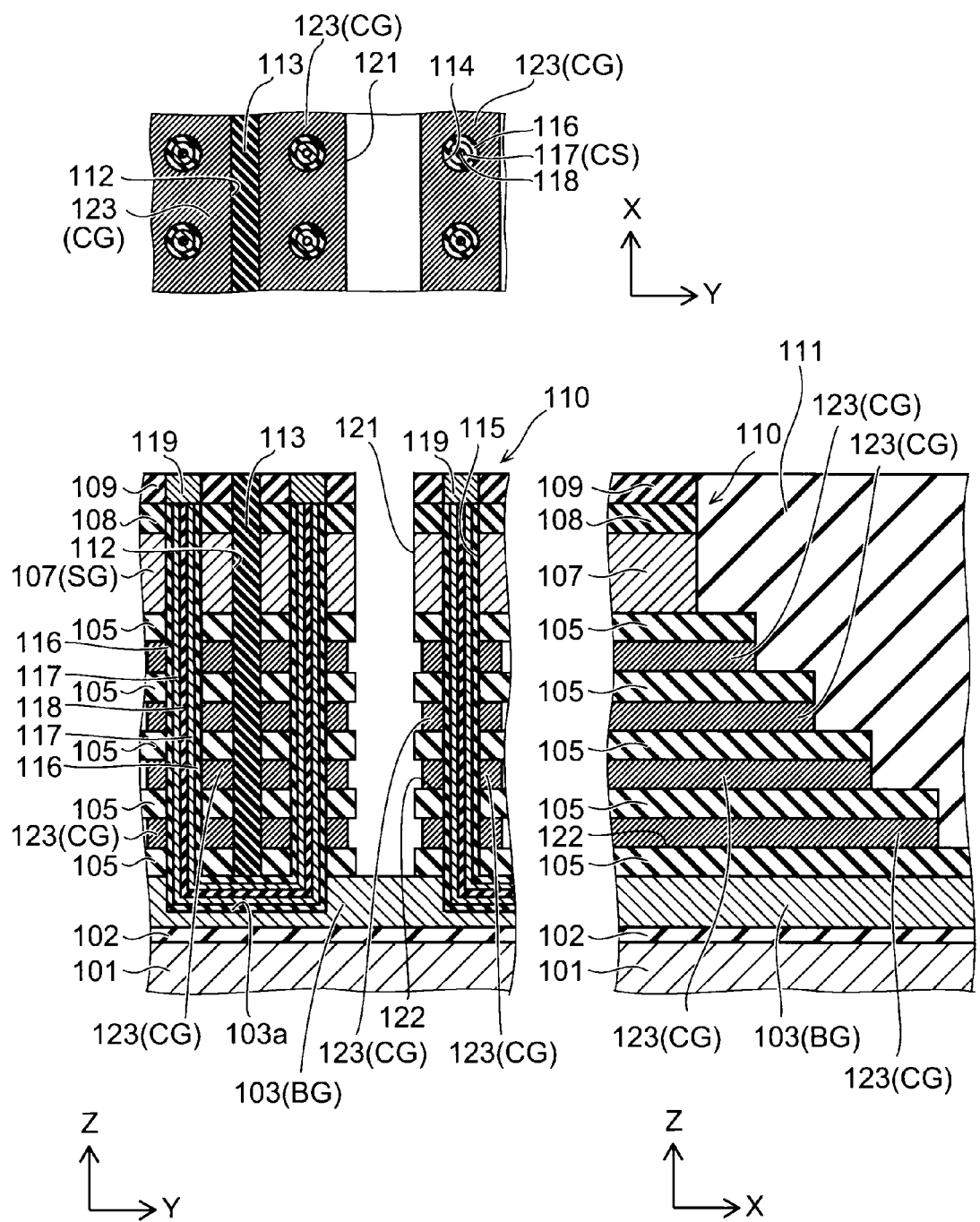

Continuing as illustrated in FIG. 7, tantalum nitride (TaN) is deposited using ALD; and then tungsten (W) is deposited using CVD. Thereby, a TaN/W stacked film 123 is formed on the entire surface. The TaN/W stacked film 123 is formed also inside the cavity 122. Subsequently, etch-back is performed by gaseous etching using $NF_3$ gas. Thereby, the TaN/W stacked film 123 remains only inside the cavity 122 to become control gate electrodes CG. As a result, a metal gate made of a metal and a metal nitride is formed as the control gate electrode CG.

Continuing as illustrated in FIG. 8, a silicon oxide film 124 is formed on the entire surface by performing CVD using TEOS (tetra ethyl ortho silicate) and ozone ($O_3$) as the source materials; and the upper surface is planarized. The silicon oxide film 124 is filled also into the trench 121. Then, contact holes are made in the silicon oxide film 124 in the region directly above the polycrystalline silicon member 119 and the region directly above each of the levels formed in the end portion of the stacked body 110 and filled with tungsten (W) using CVD. Thereby, contact plugs 125 are formed to be respectively connected to the polycrystalline silicon member 119 and the control gate electrodes CG.

Thereafter, the upper interconnect structure is formed using normal methods. In other words, a source line 126 extending in the X direction is formed on the silicon oxide film 124 and connected to the contact plug 125 connected to one of the upper end portions of the U-shaped hole 115. Then, an inter-layer insulating film 127 is formed to cover the source line 126. Continuing, a contact plug 128 is formed inside the inter-layer insulating film 127 to connect to the contact plug 125 connected to the other upper end portion of the U-shaped hole 115. Then, a bit line 129 extending in the Y direction is formed on the inter-layer insulating film 127 and connected to the contact plug 128. Continuing, an inter-layer insulating film 130 is formed to cover the bit line 129; and an upper layer interconnect 131 is formed thereon. Then, an inter-layer insulating film 132 is formed to cover the upper layer interconnect 131. Thus, the semiconductor memory device 100 is manufactured.

In the semiconductor memory device 100 thus manufactured as illustrated in FIG. 8, FIG. 9, and FIG. 10, the control gate electrode CG made of the TaN/W stacked film 123 is stacked alternately with the inter-electrode insulating film made of the NSG film 105 on the silicon substrate 101; and the selection gate electrode SG made of the boron-doped polycrystalline silicon film 107 is provided thereon. The channel semiconductor CS made of the boron-doped polycrystalline silicon film 117 pierces these films. The memory film 116 is provided between the channel semiconductor CS and the selection gate electrode SG and between the channel semiconductor CS and the control gate electrodes CG. Memory cells are formed at the intersections between the channel semiconductor CS and the control gate electrodes CG. A selection transistor is formed at the intersection between the channel semiconductor CS and the selection gate electrode SG.

Effects of the embodiment will now be described.

In the embodiment as illustrated in FIG. 1, the stacked body 110 mainly made of the NSG films 105 and the BSG films 106 is formed; subsequently, the through-hole 114 is made in the stacked body 110 as illustrated in FIG. 3; subsequently, the BSG films 106 are removed as illustrated in FIG. 6; and the control gate electrodes CG are formed as illustrated in FIG. 7. Therefore, the greater part of the stacked body 110 is formed of insulating materials when the through-hole 114 is made. As a result, the through-hole can be patterned vertically more easily than in the case where a stacked body of a conductive film and an insulating film is patterned.

In the embodiment, in the processes illustrated in FIG. 6 and FIG. 7, the control gate electrode CG is formed by replacing the BSG film 106 with the TaN/W stacked film 123. Therefore, the control gate electrode CG can be formed after the formation of the memory film 116 and the channel semiconductor CS (the boron-doped polycrystalline silicon film 117). Thereby, it is easier to employ a metal gate as the control gate electrode CG; and the resistance of the control gate electrode CG can be reduced. On the other hand, because the NSG film 105 can be utilized as-is as the inter-electrode insulating film, there is little impact on the manufacturing process.

In the embodiment, the stacked body 110 is formed by alternately stacking the NSG film 105 and the BSG film 106; and the through-hole 114 is formed by collectively patterning the stacked body 110. Thereby, the bit capacity per unit surface area can be increased by stacking the memory cells without greatly increasing the number of processes. Therefore, the bit density of the memory cells can be increased without shrinking the planar structure.

Further, in the embodiment, the charge blocking film, the charge trap film, and the tunneling dielectric film are stacked in this order on the inner surface of the through-hole 114. Thereby, the curvature radius of the tunneling dielectric film can be smaller than the curvature radius of the charge blocking film; and the electric field can be concentrated more intensely by the tunneling dielectric film. As a result, the programming/erasing characteristics can be drastically improved compared to a planar MONOS structure; and MLC (multi level cell) operations can be realized easily. Because the memory film 116 is disposed inside the through-hole 114 in the embodiment, the arrangement period of the through-hole 114 can be short; and shrinking of the planar structure can be realized.

Because only the gate electrodes (the control gate electrodes CG and the selection gate electrode SG) and the inter-gate electrode insulating films (the NSG films 105, etc.) are stacked in the stacking direction (the Z direction) in the stacked body 110, the bit density in the stacking direction can be increased easily by reducing the thicknesses of the gate electrodes and the inter-gate electrode insulating films. In other words, it is easy to reduce the film thickness in the stacking direction; and an increase of the height of the stacked body 110 can be suppressed even in the case where the number of stacks of the control gate electrodes CG is increased. Any electrode length of the control gate electrode CG can be selected by controlling the film thickness of the BSG film 106.

Because the channel semiconductor CS is filled into the U-shaped hole 115 in the embodiment, the configuration of the channel semiconductor CS also may be U-shaped. Thereby, the conduction of the two end portions of the channel semiconductor CS can be controlled by the selection gate electrodes SG formed by subdividing one layer of the boron-doped polycrystalline silicon film 107. Accordingly, the number of stacks of the stacked body 110 can be lower than in the case where two layers are formed for the selection gate electrode.

Furthermore, in the embodiment, the selection gate electrodes SG are formed of the boron-doped polycrystalline silicon film 107. Thereby, the gate length of the selection transistor, i.e., the film thickness of the selection gate electrode SG, can be set independently from the film thickness of the control gate electrode CG. As a result, it is possible to sufficiently ensure the cut-off characteristics of the selection transistor.

In the embodiment, the contact plug 125 is formed after the formation of the memory cells formed of the memory film 116, the channel semiconductor CS, the control gate electrodes CG, etc. Thereby, the contact plug 125 does not degrade when forming the memory cells.

In the embodiment, the channel semiconductor CS is formed in a tubular configuration. Thereby, fluctuation of the threshold voltage (Vth) between the memory cells can be suppressed because the thickness of the channel semiconductor is uniform between the memory cells.

A first modification of the first embodiment will now be described.

Figure 11:
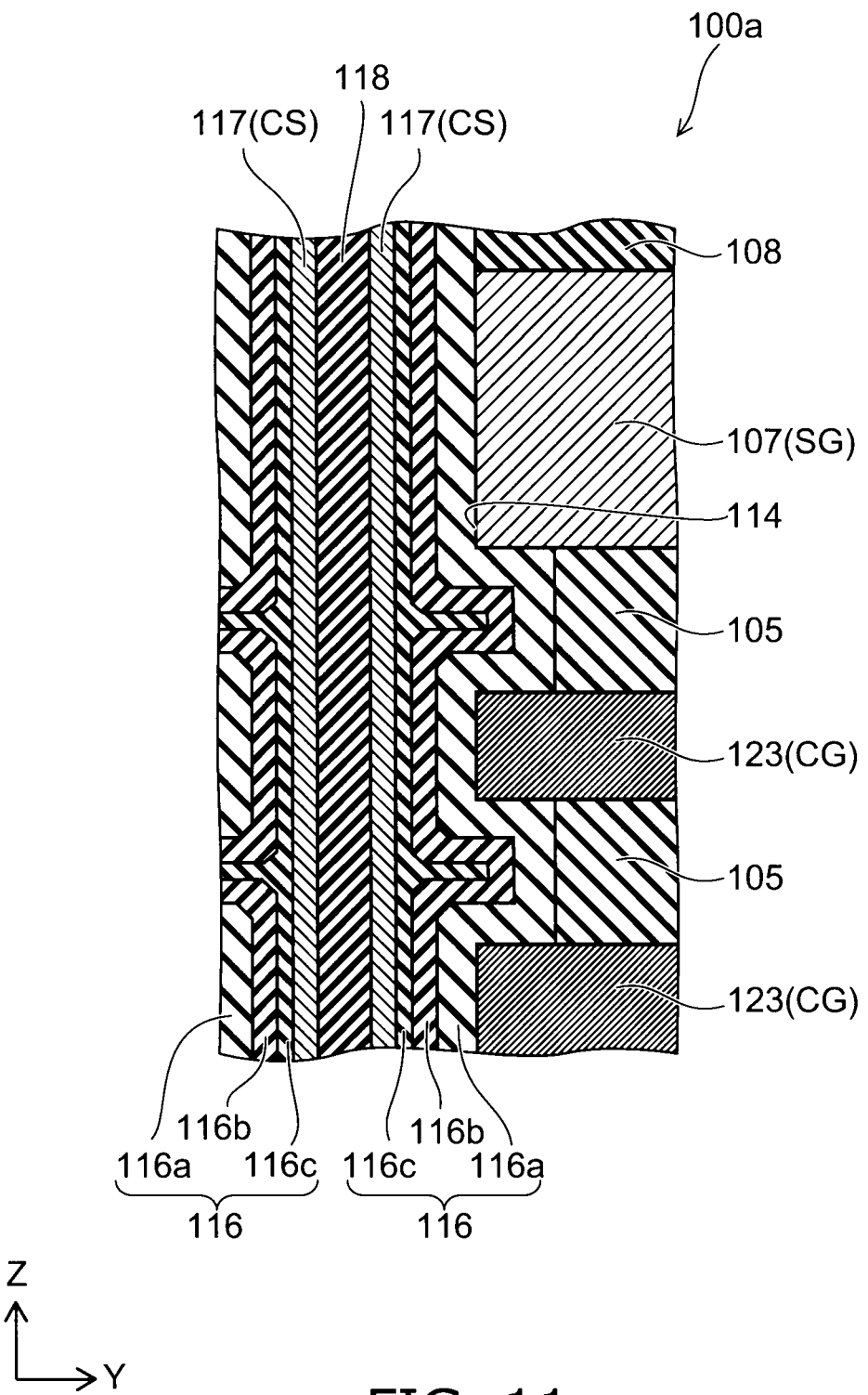
FIG. 11 is a cross-sectional view illustrating a memory cell periphery of a semiconductor memory device according to a first modification of the first embodiment.

FIG. 11 is a cross-sectional view illustrating the memory cell periphery of the semiconductor memory device according to the modification.

In the case where the channel semiconductor CS is shared, one of two memory cells adjacent to each other in the Z direction is a selected cell, and the other is an unselected cell, a programming voltage $V_{pgm}$ having a high voltage is applied to the control gate electrode CG of the selected cell; and a conduction voltage $V_{pass}$ having an intermediate voltage is applied to the control gate electrode CG of the unselected cell. Thereby, an electric field is generated in the Z direction; and the charge stored in the charge trap film inside the memory film 116 may undesirably move in the Z direction. Such a phenomenon is called program disturbance.

In the modification as illustrated in FIG. 11, the NSG films 105 are caused to recede from the inner surface of the through-hole 114 by performing isotropic etching via the through-hole 114 between the processes illustrated in FIG. 3 and the processes illustrated in FIG. 4. Thereby, a portion of the memory film 116 enters between the BSG films 106 in the Z direction. Because the BSG films 106 are replaced with the control gate electrodes CG in a subsequent process, the memory film 116 enters between the control gate electrodes CG in the semiconductor memory device 100a after completion. In other words, the charge trap film is bent in a direction perpendicular to the stacking direction (the Z direction). Therefore, in the semiconductor memory device 100a according to the modification, the charge stored inside the charge trap film does not move easily through the charge trap film. As a result, the occurrence of the program disturbance can be suppressed; and degradation of the data retention can be prevented. Otherwise, the manufacturing method, the configuration, and the effects of the modification are similar to those of the first embodiment described above.

A second modification of the first embodiment will now be described.

Figure 12:
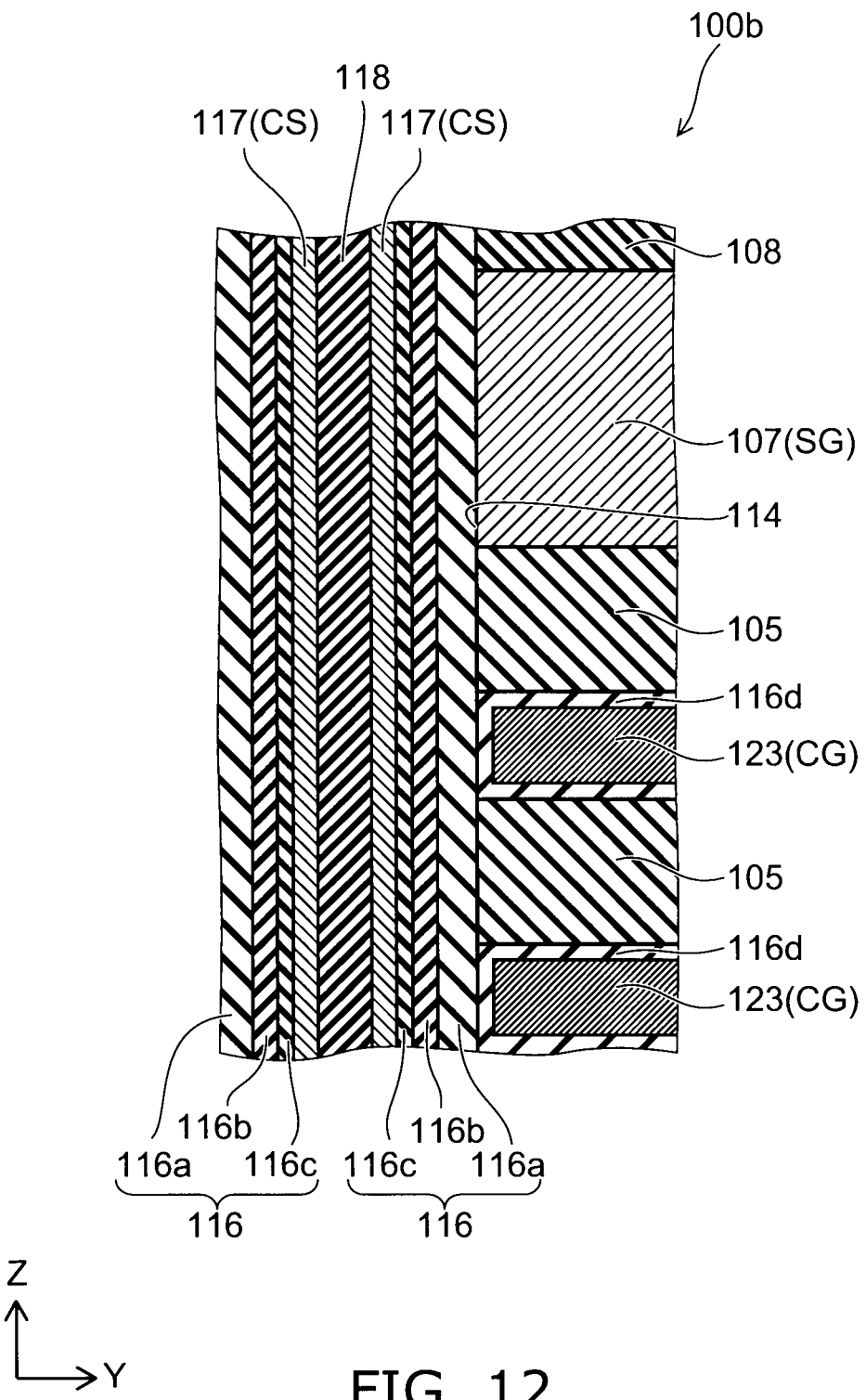
FIG. 12 is a cross-sectional view illustrating a memory cell periphery of a semiconductor memory device according to a second modification of the first embodiment.

FIG. 12 is a cross-sectional view illustrating the memory cell periphery of the semiconductor memory device according to the modification.

As illustrated in FIG. 12, the two charge blocking films 116a and 116d are provided in the semiconductor memory device 100b according to the embodiment. The charge blocking film 116a is formed in a tubular configuration on the inner surface of the U-shaped hole 115 similarly to the first embodiment described above. On the other hand, the charge blocking film 116d is formed to cover the control gate electrodes CG. The charge blocking film 116d can be formed by depositing an insulating material such as, for example, alumina on the inner surface of the cavity 122 made by removing the BSG films 106.

According to the embodiment, the control gate electrodes CG are formed by depositing the TaN/W stacked film 123 after the charge blocking film 116d is formed. Thereby, the control of the interface between the memory film 116 and the control gate electrodes CG is easier; and the leak current can be suppressed. The increase of the height of the memory cell unit can be suppressed even in the case where the number of stacks is increased because only the electrode films, the inter-electrode insulating films, and a portion of the charge blocking film exist in the stacking direction (the Z direction). Otherwise, the manufacturing method, the configuration, and the effects of the modification are similar to those of the first embodiment described above.

A second embodiment will now be described.

The embodiment is an example in which a selection gate electrode having any gate length is formed by alternately stacking a silicon oxide film used to form the inter-electrode insulating film with a silicon nitride film used to form the sacrificial insulating film to form stacked memory cells, forming the silicon nitride film used to form the sacrificial insulating film also in the space where the selection gate electrode is to be formed, and by subsequently replacing the sacrificial insulating film with a conductive film.

FIG. 13 to FIG. 18 are cross-sectional views of processes that illustrate the method for manufacturing the semiconductor memory device according to the embodiment and illustrating three mutually orthogonal cross sections.

Figure 19:
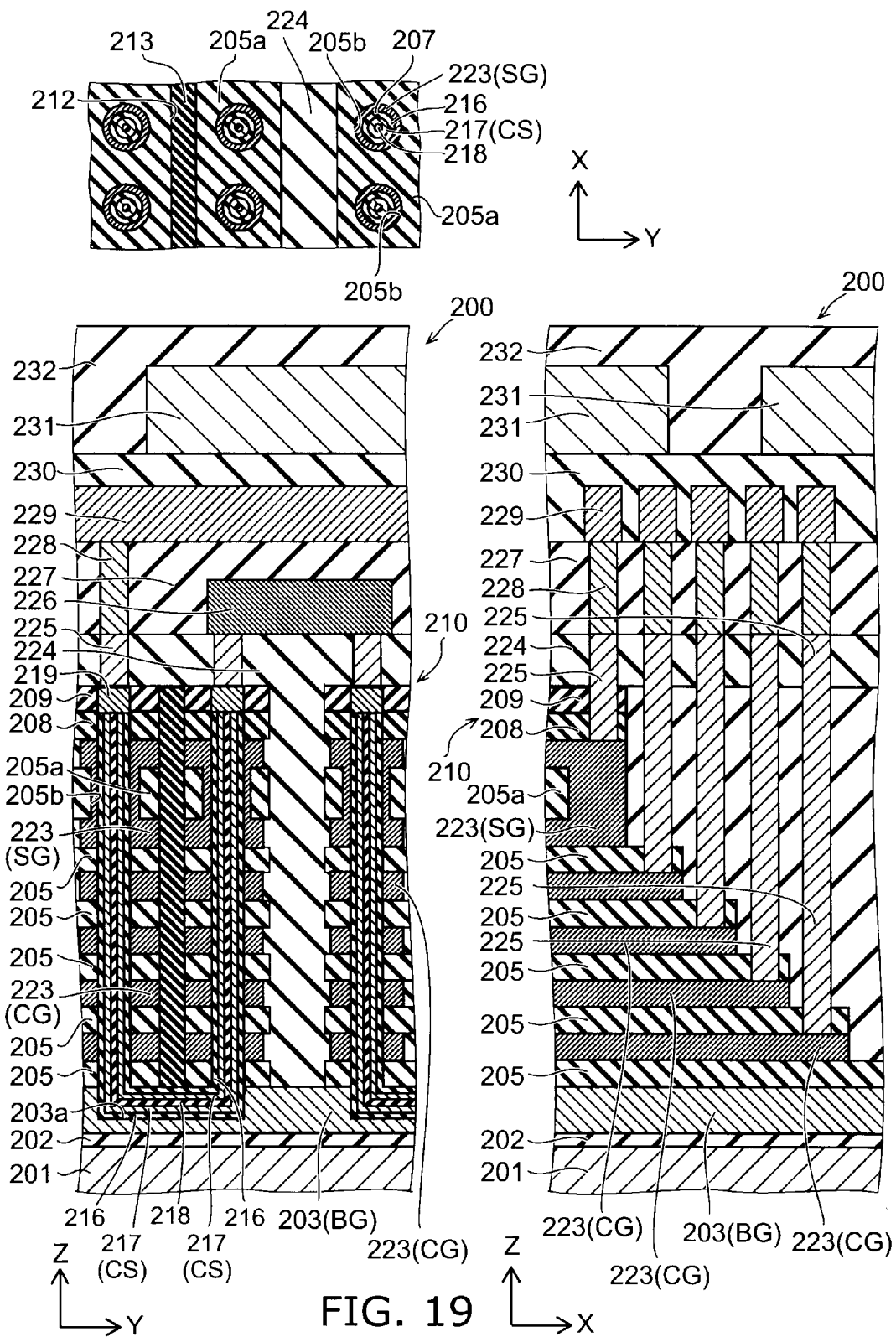
FIG. 19 is a cross-sectional view that illustrates the semiconductor memory device according to the second embodiment.

FIG. 19 is a cross-sectional view that illustrates the semiconductor memory device according to the embodiment and illustrates three mutually orthogonal cross sections.

Figure 20:
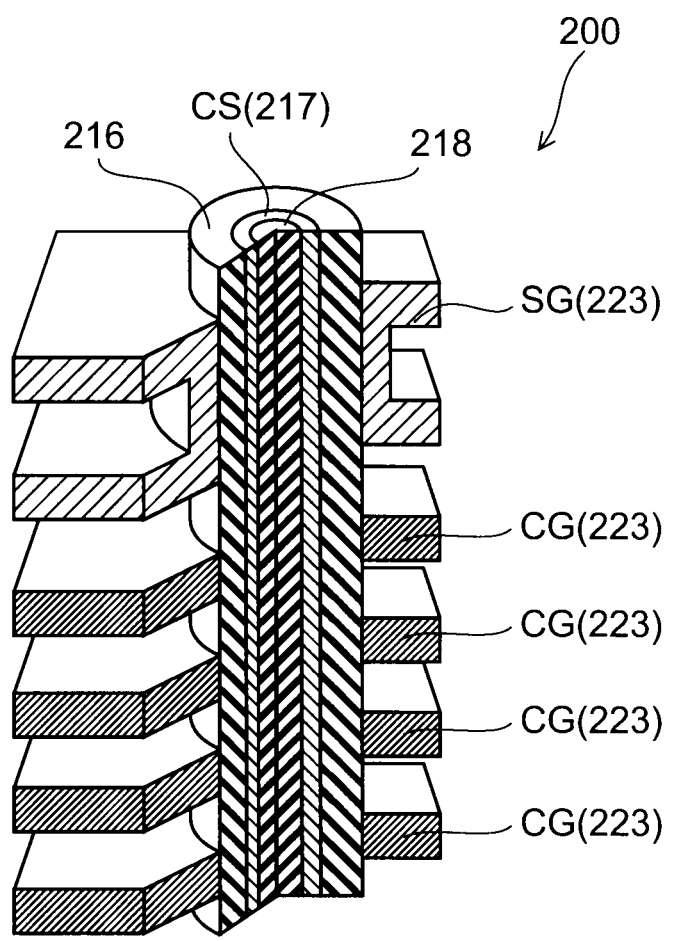
FIG. 20 is a perspective view illustrating a memory cell periphery of the semiconductor memory device according to the second embodiment.

FIG. 20 is a perspective view illustrating the memory cell periphery of the semiconductor memory device according to the embodiment.

Figure 21:
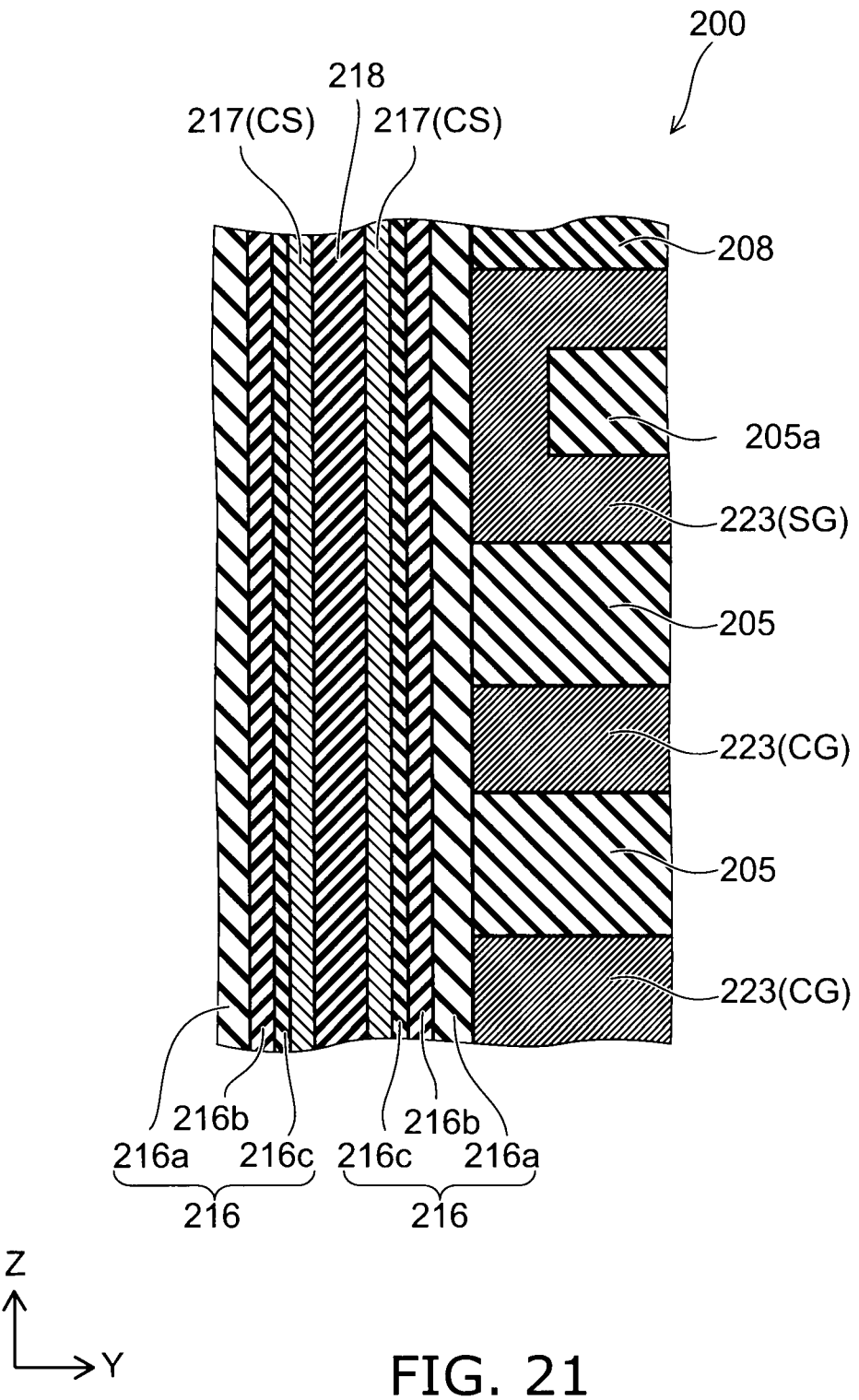
FIG. 21 is a cross-sectional view illustrating the memory cell periphery of the semiconductor memory device according to the second embodiment.
Figure 22:
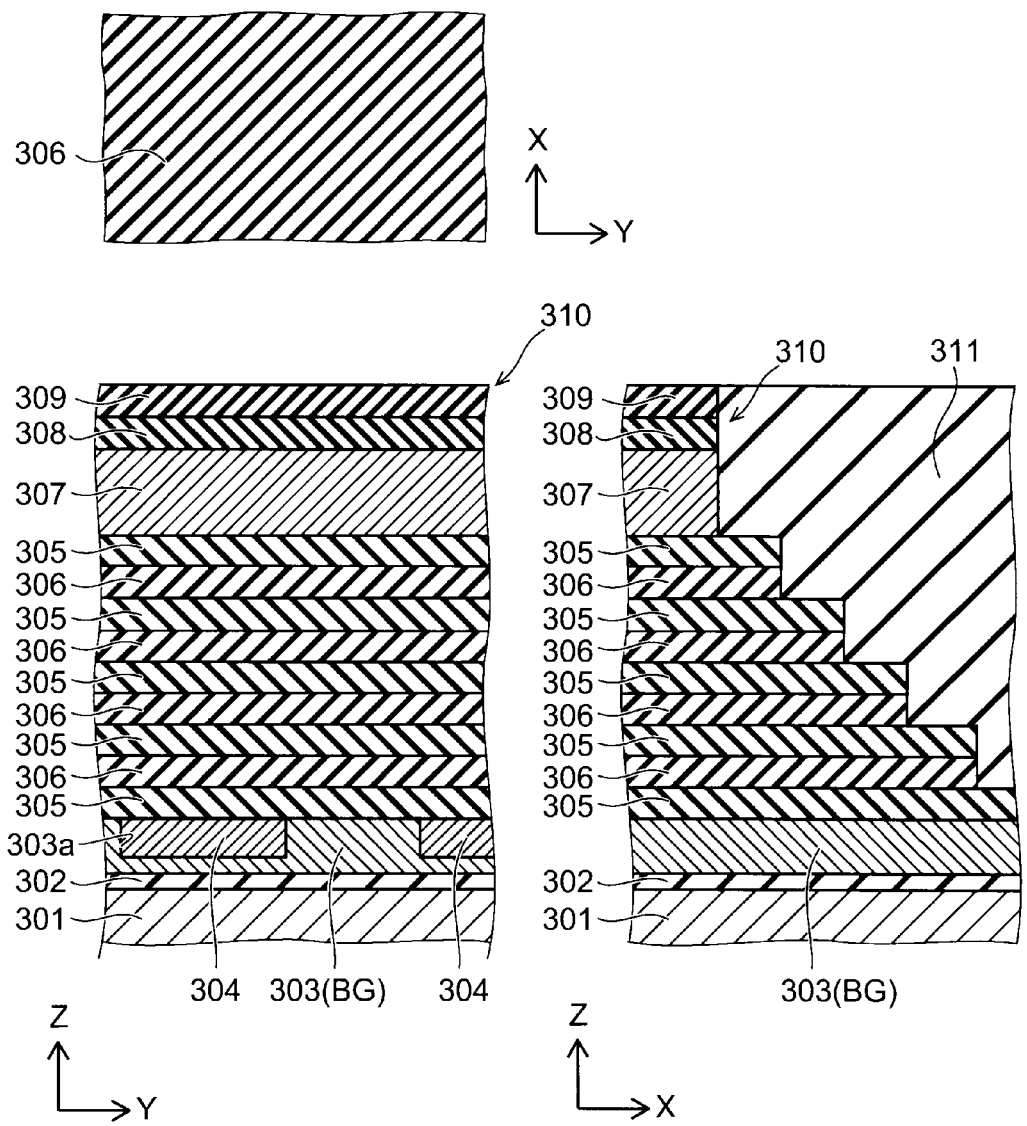
FIG. 22 to FIG. 27 are cross-sectional views of processes that illustrate a method for manufacturing a semiconductor memory device according to a third embodiment.

FIG. 21 is a cross-sectional view illustrating the memory cell periphery of the semiconductor memory device according to the embodiment.

Figure 13:
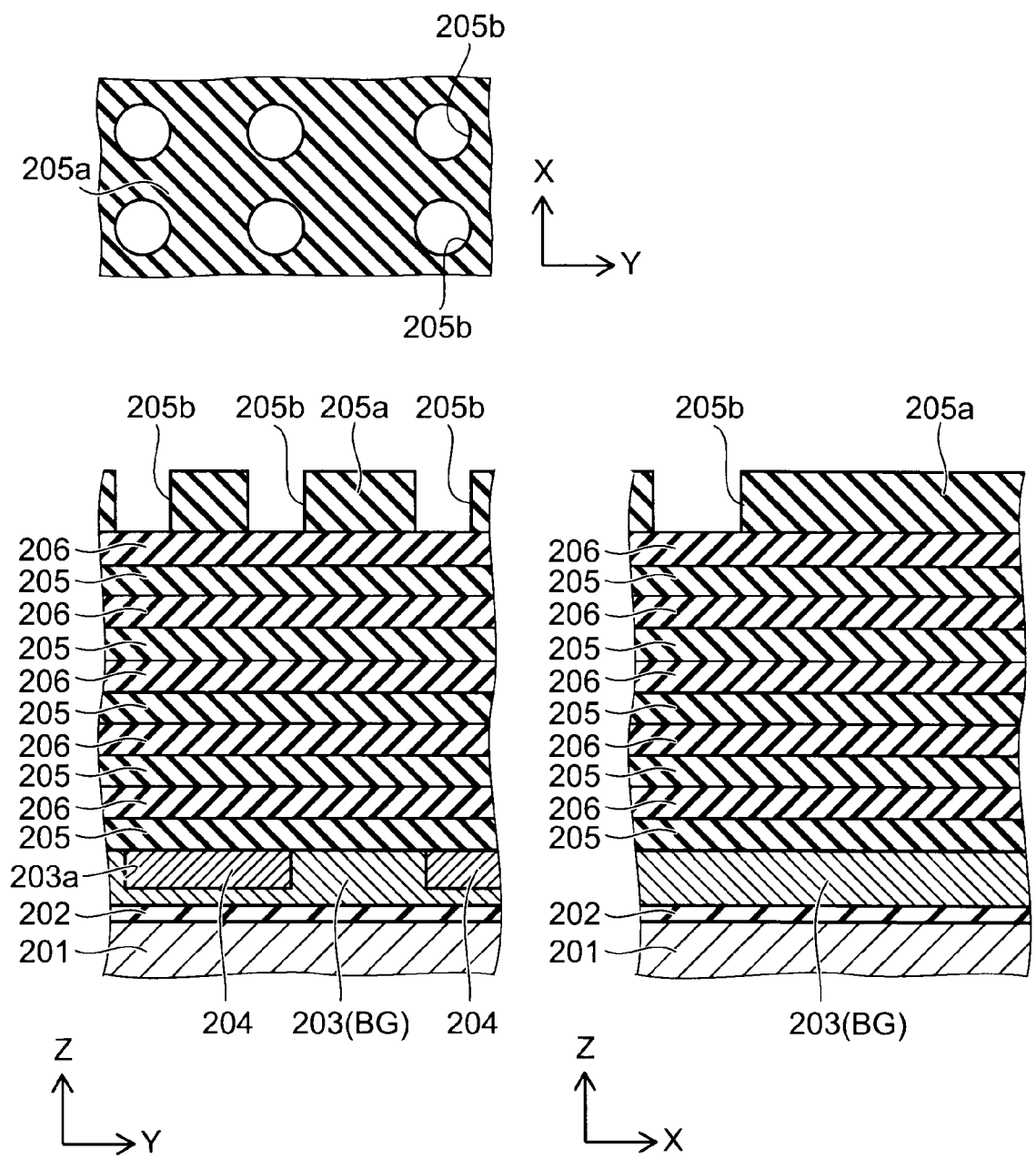
FIG. 13 to FIG. 18 are cross-sectional views of processes that illustrate a method for manufacturing a semiconductor memory device according to a second embodiment.

First, as illustrated in FIG. 13, a peripheral circuit (not illustrated) is formed in the peripheral circuit unit by forming transistors, etc., in the upper surface of a silicon substrate 201. On the other hand, a silicon oxide film 202 is formed in the memory cell unit. Then, a phosphorus (P)-doped polycrystalline silicon film 203 is formed on the silicon oxide film 202. Then, the back gate electrode BG is formed by patterning the phosphorus-doped polycrystalline silicon film 203 using lithography and RIE. Continuing, an excavation 203a is made in a rectangular configuration extending in the Y direction in the upper surface of the phosphorus-doped polycrystalline silicon film 203 using lithography and RIE. Then, a silicon-germanium film 204 is deposited on the entire surface and caused to recede to remain only inside the excavation 203a.

Then, a silicon oxide film 205 made of non-doped silicon oxide is alternately deposited with a BPSG (Boron phosphorous-doped silicate glass) film 206 on the entire surface by using CVD. The silicon oxide film 205 is a film used to form the inter-electrode insulating film in the semiconductor memory device after completion; and the BPSG film 206 is a sacrificial insulating film removed in a subsequent process. The silicon oxide film 205 and the BPSG film 206 are formed alternately one layer at a time such that the uppermost layer is the BPSG film 206. For example, five layers of the silicon oxide film 205 and five layers of the BPSG film 206 are deposited in the embodiment.

Continuing, a silicon oxide film 205a is formed. The silicon oxide film 205a is formed to be thicker than the silicon oxide film 205 and the BPSG film 206. Then, an opening 205b is made in the silicon oxide film 205a using lithography and RIE. The openings 205b are made in the regions directly above both of the Y-direction end portions of the excavation 203a of the phosphorus-doped polycrystalline silicon film 203.

Figure 14:
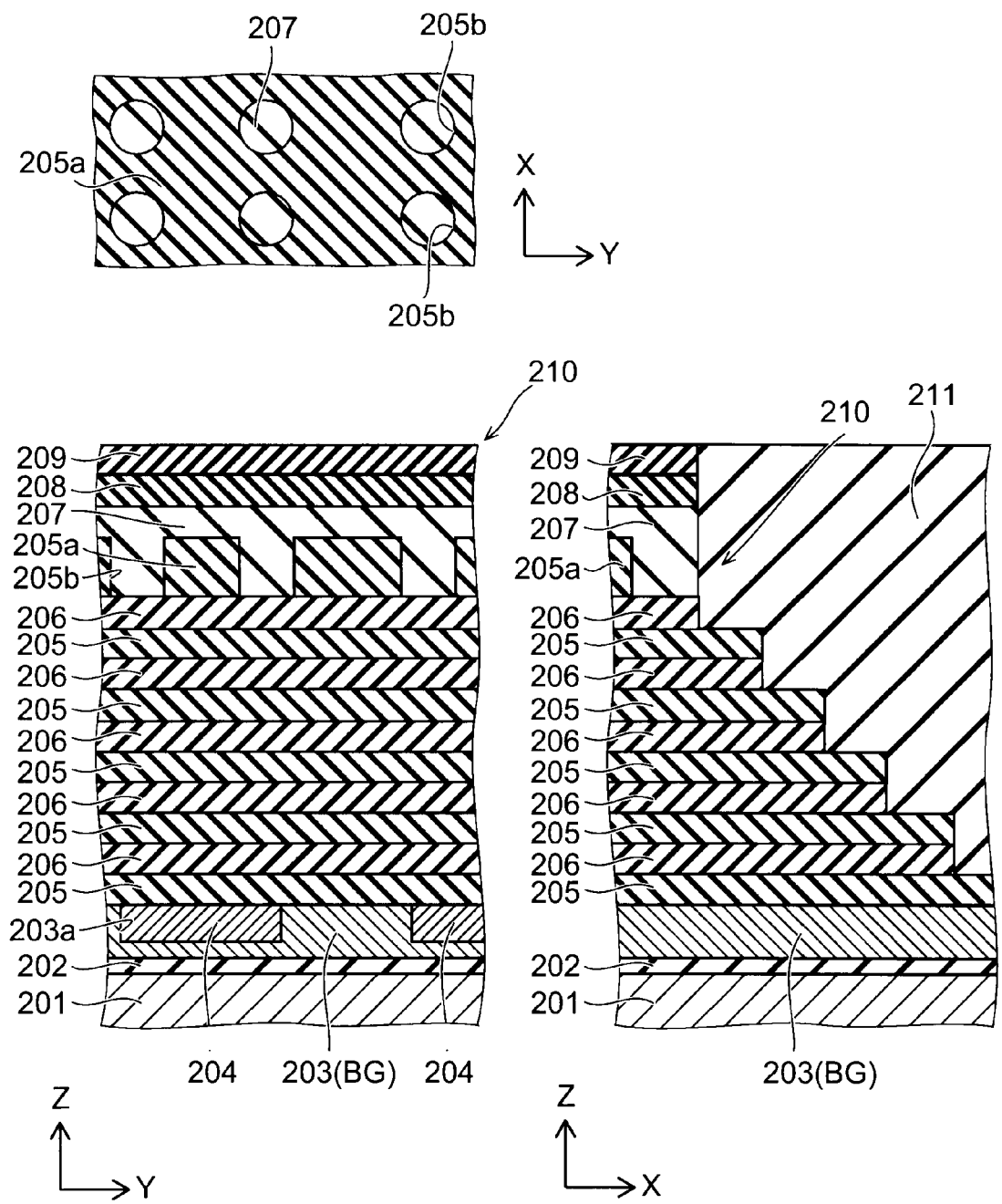

Then, as illustrated in FIG. 14, a BPSG film 207 is formed on the entire surface using CVD. At this time, the BPSG film 207 fills the interior of the opening 205b. Then, a silicon oxide film 208 and a silicon nitride film 209 are formed using PECVD (plasma enhanced CVD). Thereby, a stacked body 210 made of the silicon oxide film 205, the BPSG film 206, the silicon oxide film 205a, the BPSG film 207, the silicon oxide film 208, and the silicon nitride film 209 is formed on the phosphorus-doped polycrystalline silicon film 203, i.e., the back gate electrode BG.

Continuing, a resist pattern (not illustrated) is formed on the stacked body 210 to cover the memory cell region; and the stacked body 210 is patterned into a stairstep configuration at the end portion of the memory cell region by repeatedly executing RIE using the resist pattern as a mask and slimming the resist pattern. At this time, the upper surface of the silicon oxide film 205 is exposed at each of the levels of the stairstep. Subsequently, the stacked body 210 is buried by depositing a NSG film 211 on the entire surface; and the silicon nitride film 209 is exposed by planarizing the upper surface of the NSG film 211.

Figure 15:
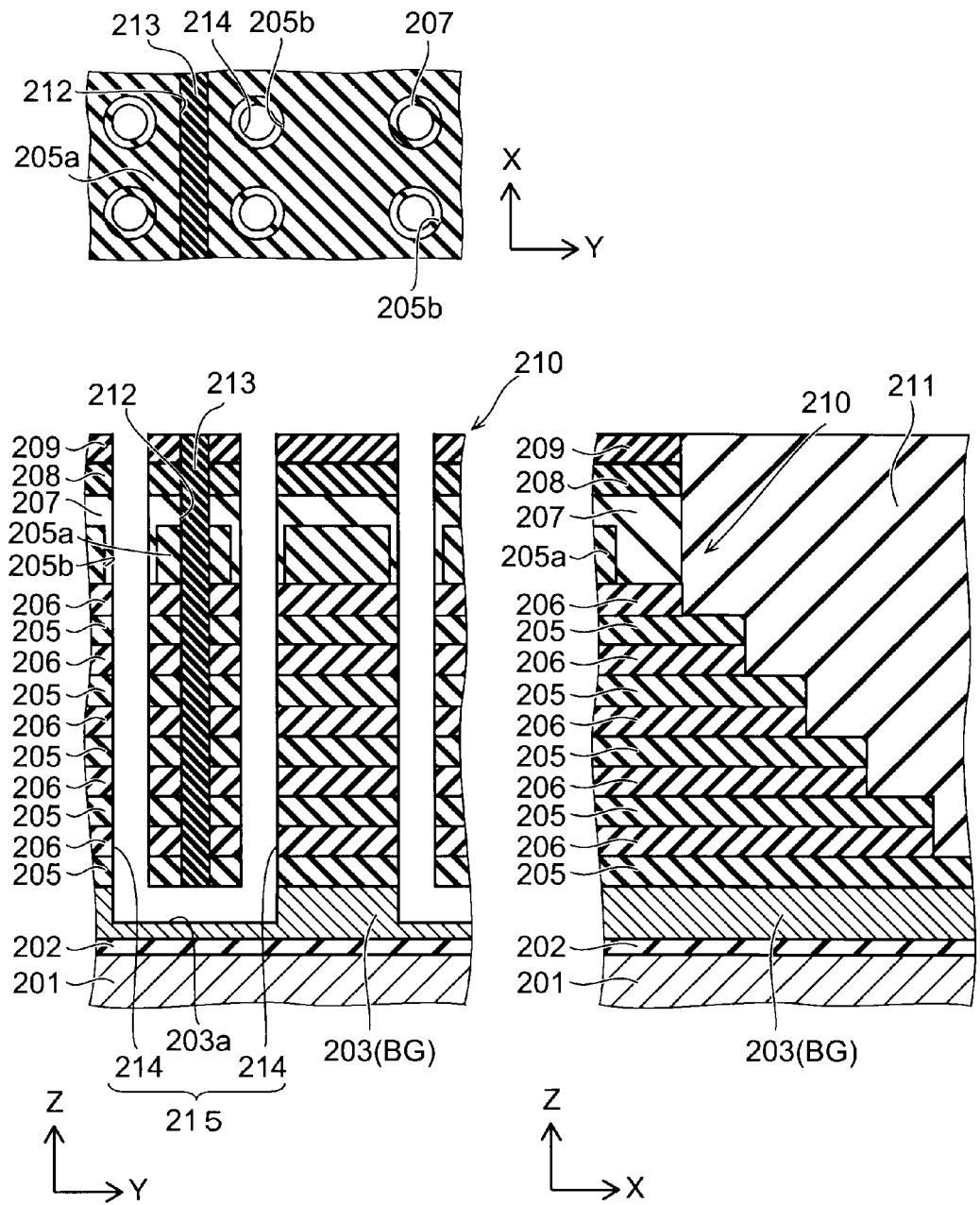

Then, as illustrated in FIG. 15, a carbon film (not illustrated) is formed on the entire surface using PECVD; and the carbon film is patterned by lithography and RIE. Then, a trench 212 is made by selectively removing the stacked body 210 by performing RIE using the carbon film as a mask. The trench 212 extends in the X direction and is made to pass through the region directly above the longitudinal-direction central portion (Y-direction central portion) of the excavation 203a of the phosphorus-doped polycrystalline silicon film 203. Then, silicon oxide is deposited on the entire surface; and the upper surface is planarized. Thereby, a silicon oxide member 213 is formed by the silicon oxide remaining inside the trench 212. Subsequently, the carbon film is removed.

Continuing, a carbon film (not illustrated) is formed on the entire surface using PECVD and patterned using lithography and RIE. Then, the stacked body 210 is selectively removed by performing RIE using the patterned carbon film as a mask. Thereby, through-holes 214 extending in the Z direction are made in the stacked body 210. The through-holes 214 are made inside the openings 205b as viewed from the Z direction to reach both of the Y-direction end portions of the excavation 203a. Then, the silicon-germanium film 204 filled into the excavation 203a is removed via the through-hole 214 by performing dry etching using chlorine gas. Thereby, a U-shaped hole 215 is made in which two of the through-holes 214 connect with one of the excavations 203a.

Figure 16:
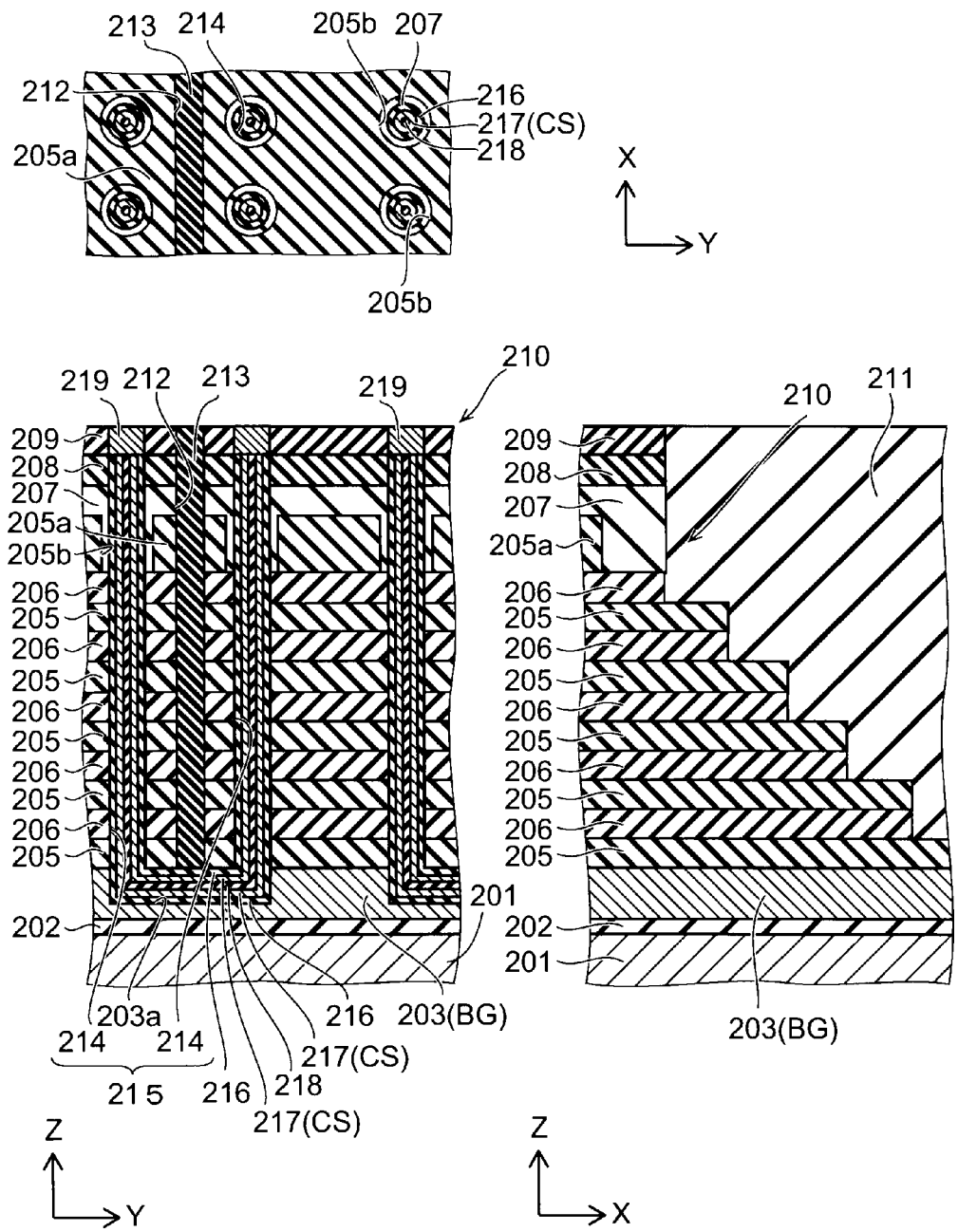

Then, as illustrated in FIG. 16, a memory film 216 is formed by depositing a charge blocking film 216a, a charge trap film 216b, and a tunneling dielectric film 216c (referring to FIG. 21) in this order on the inner surface of the U-shaped hole 215 using ALD or LPCVD. The charge blocking film 216a is formed by depositing an ONO film using, for example, LPCVD. The charge trap film 216b is formed by depositing silicon nitride using, for example, ALD. The tunneling dielectric film 216c is formed by depositing a silicon oxide film using, for example, ALD.

Continuing, a phosphorus-doped polycrystalline silicon film 217 is formed on the memory film 216. The phosphorus-doped polycrystalline silicon film 217 is a film used to form the channel semiconductor CS. The phosphorus-doped polycrystalline silicon film 217 is formed in a tubular configuration along the inner surface of the U-shaped hole 215. Then, silicon nitride 218 is filled into the remaining portion inside the U-shaped hole 215, i.e., the space around which the phosphorus-doped polycrystalline silicon film 217 having the tubular configuration is provided, by using, for example, ALD. Thereby, the memory film 216, the phosphorus-doped polycrystalline silicon film 217, and the silicon nitride 218 are formed inside the U-shaped hole 215 in order from the outside.

Then, a recess is made in the upper portion of the U-shaped hole 215 by causing the memory film 216, the phosphorus-doped polycrystalline silicon film 217, and the silicon nitride 218 formed inside the U-shaped hole 215 to recede by performing RIE. Then, a polycrystalline silicon member 219 is filled into the recess. Continuing, the source region (not illustrated) and the drain region (not illustrated) are formed by introducing arsenic (As) to the polycrystalline silicon member 219 using lithography and ion implantation.

Figure 17:
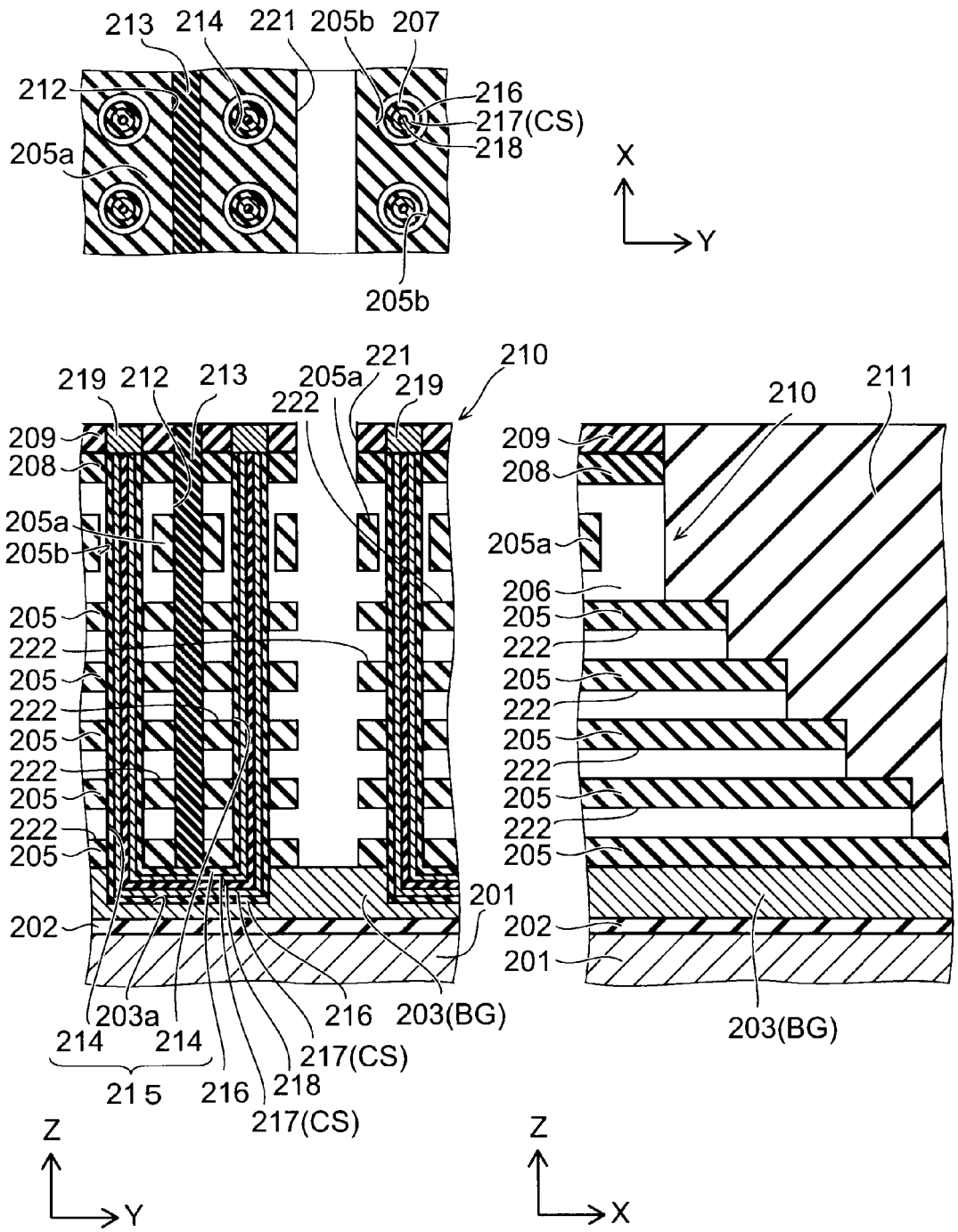

Continuing as illustrated in FIG. 17, a carbon film (not illustrated) is formed on the entire surface using PECVD and patterned using lithography and RIE. Then, a trench 221 is made in the stacked body 210 by performing RIE using the patterned carbon film as a mask. The trench 221 is made to extend in the X direction between the U-shaped holes 215 adjacent to each other in the Y direction. The stacked body 210 is subdivided by the trenches 212 and 221 into gate electrode configurations as viewed from the Z direction. Subsequently, the carbon film is removed.

Then, hydrofluoric acid vapor etching is performed. Thereby, the BPSG films 206 and 207 (referring to FIG. 16) are removed via the trench 221. At this time, the other films, e.g., the silicon oxide films 205 and 205a, the memory film 216, the silicon oxide member 213, etc., substantially are not removed. As a result, a cavity 222 forms in the portion where the BPSG films 206 and 207 were formed. The cavity 222 is a space that forms a mold of the control gate electrodes and the selection gate electrode in a subsequent process.

Figure 18:
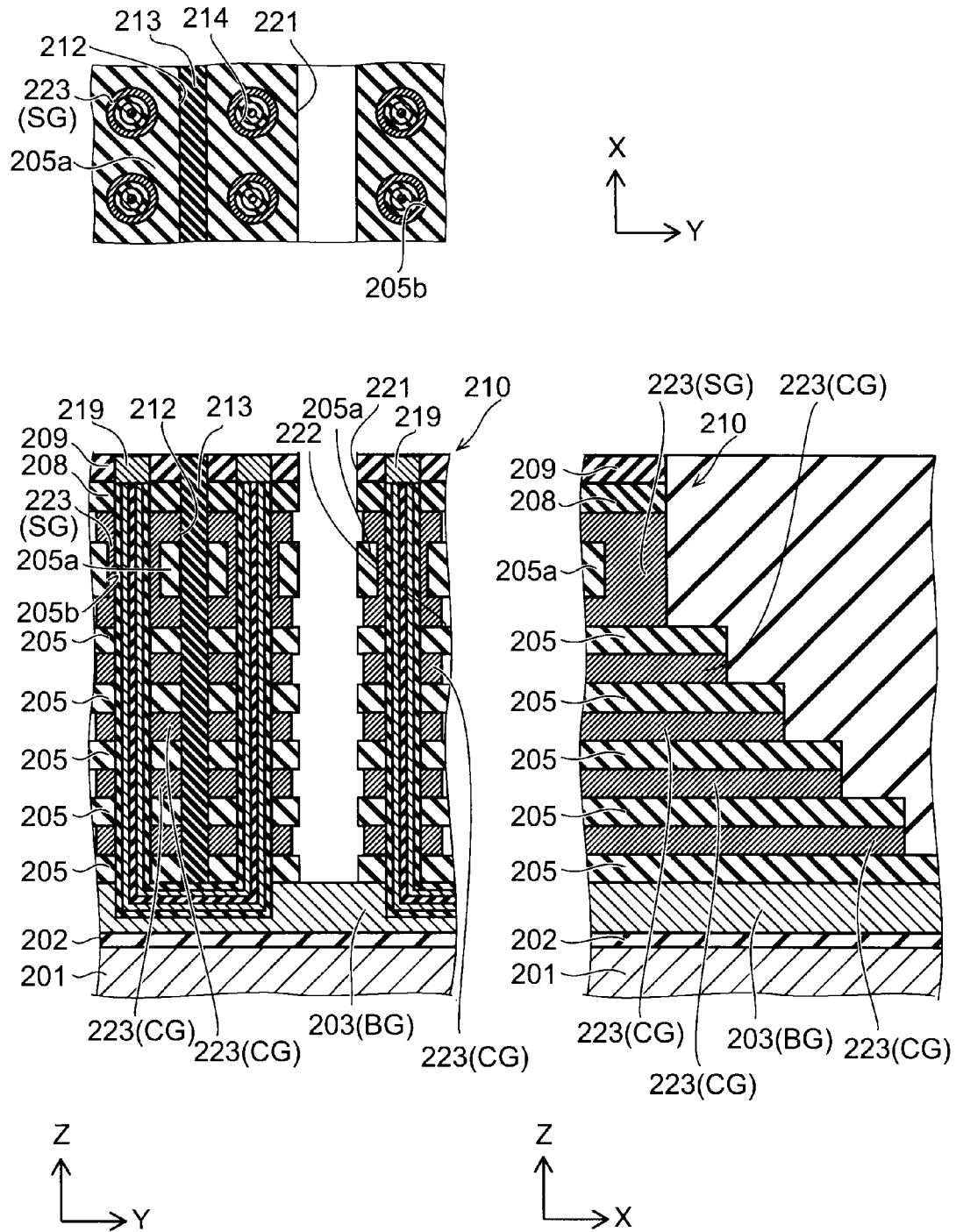

Continuing as illustrated in FIG. 18, the memory film 216 is modified by performing ISSG (In-situ steam generator) oxidization. Then, a thin silicon nitride layer (not illustrated) is formed using ALD. The thin silicon nitride layer is used to form a portion of the charge blocking film of the memory film 216 that stabilizes the electrode interface. Then, tantalum nitride (TaN) is deposited using ALD. Continuing, tungsten (W) is deposited using CVD. Thereby, a TaN/W stacked film 223 is formed on the entire surface. The TaN/W stacked film 223 is formed also inside the cavity 222. At this time, the TaN/W stacked film 223 is deposited to cover the silicon oxide film 205a and enter between the silicon oxide film 205a and the memory film 216.

Subsequently, etch-back is performed by gaseous etching using dilute $ClF_3$ gas. Thereby, the TaN/W stacked film 223 remains only inside the cavity 222 to form the control gate electrodes CG and the selection gate electrode SG. At this time, the cross section of the selection gate electrode SG has a C-shaped configuration because the TaN/W stacked film 223 remains between the silicon oxide film 205a and the memory film 216 and on the upper surface and the lower surface of the silicon oxide film 205a and is removed from the inner surface of the trench 221.

The subsequent processes are similar to those of the first embodiment described above. Namely, as illustrated in FIG. 19, a silicon oxide film 224 is formed on the entire surface by performing CVD using TEOS and ozone ($O_3$) as the source materials; and the upper surface is planarized. Then, contact holes are made in the silicon oxide film 224 in the region directly above the polycrystalline silicon member 219 and in the region directly above each of the levels of the stairstep formed in the end portion of the stacked body 210; and tungsten (W) is filled using CVD. Thereby, contact plugs 225 are formed inside the contact holes and are connected to the polycrystalline silicon member 219 and the control gate electrodes CG. Then, a source line 226, an inter-layer insulating film 227, a contact plug 228, a bit line 229, an inter-layer insulating film 230, an upper layer interconnect 231, and an inter-layer insulating film 232 are formed on the silicon oxide film 224. Thus, the semiconductor memory device 200 is manufactured.

In the semiconductor memory device 200 thus manufactured as illustrated in FIG. 19, FIG. 20, and FIG. 21, the selection gate electrode SG is formed to cover the silicon oxide film 205a; and the cross section of the selection gate electrode SG has a C-shaped configuration.

Effects of the embodiment will now be described.

In the embodiment, the selection gate electrode SG is formed to cover the silicon oxide film 205a; and the cross section of the selection gate electrode SG has a C-shaped configuration. Thereby, not only the control gate electrode CG but also the selection gate electrode SG can be a metal gate; and the gate length of the selection gate electrode SG, i.e., the length in the Z direction, can be lengthened without thickly depositing the TaN/W stacked film 223. As a result, it is possible to sufficiently ensure the cut-off characteristics of the selection transistor. Otherwise, the manufacturing method, the configuration, and the effects of the embodiment are similar to those of the first embodiment described above.

A third embodiment will now be described.

Although the embodiment is an example in which the stacked memory cells and the selection gate electrode are formed by alternately stacking a silicon oxide film used to form the inter-electrode insulating film with a silicon nitride film used to form the sacrificial insulating film, stacking a boron-doped polycrystalline silicon film used to form the selection gate electrode thereon similarly to the first embodiment described above, and by subsequently performing collective patterning similarly to the second embodiment described above, the embodiment differs from the first and second embodiments described above in that the operation of the selection gate electrode is stabilized by not forming the charge trap layer proximal to the selection gate electrode.

FIG. 22 to FIG. 27 are cross-sectional views of processes that illustrate the method for manufacturing the semiconductor memory device according to the embodiment and illustrate three mutually orthogonal cross sections.

Figure 28:
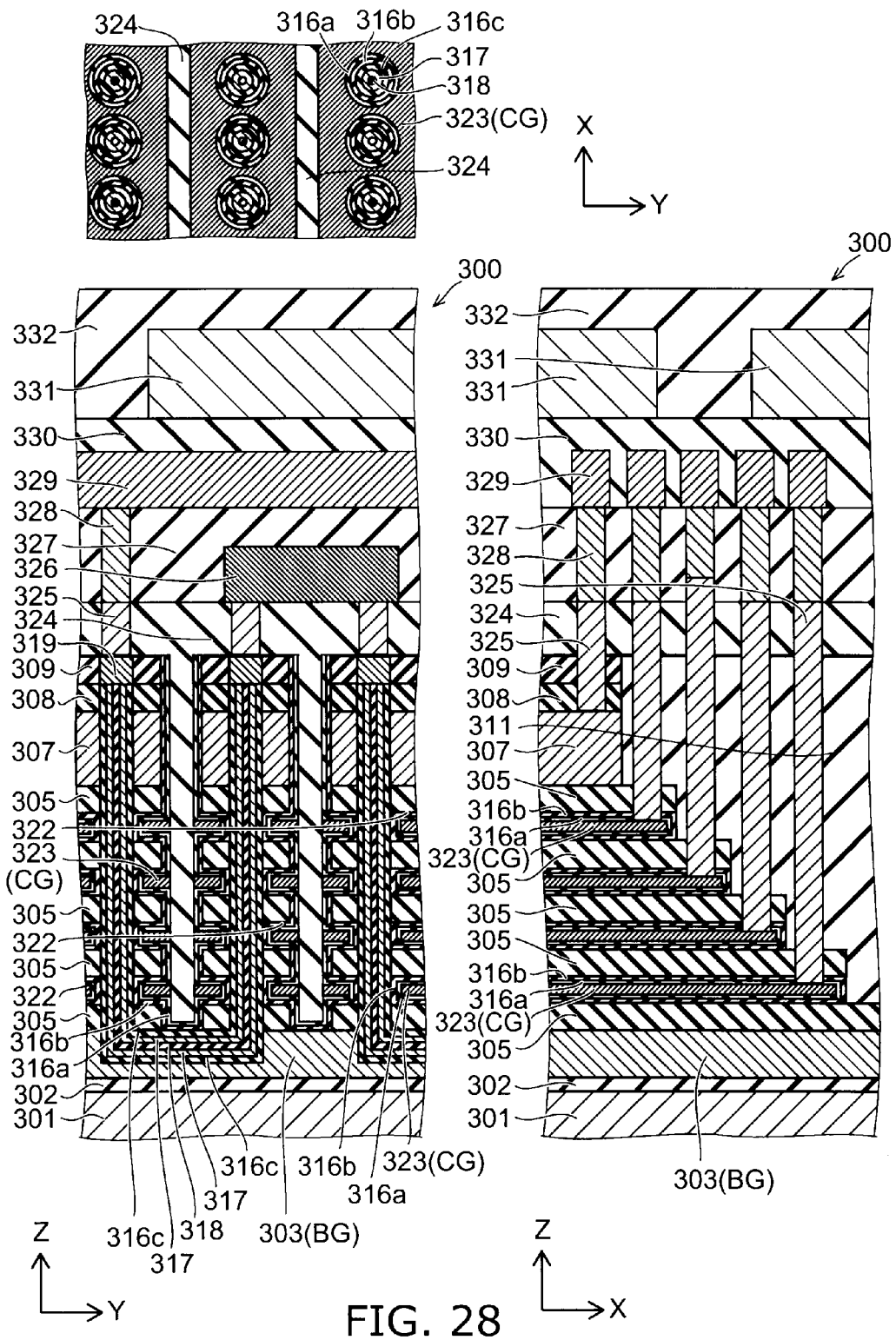
FIG. 28 is a cross-sectional view that illustrates the semiconductor memory device according to the third embodiment.

FIG. 28 is a cross-sectional view that illustrates the semiconductor memory device according to the embodiment and illustrates three mutually orthogonal cross sections.

Figure 29:
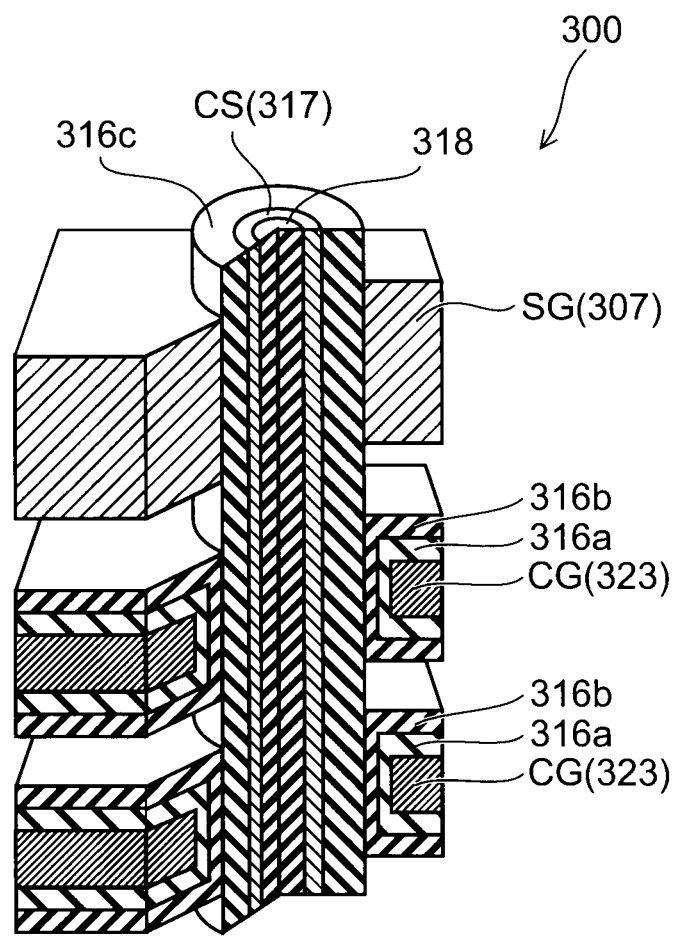
FIG. 29 is a perspective view illustrating a memory cell periphery of the semiconductor memory device according to the third embodiment.

FIG. 29 is a perspective view illustrating the memory cell periphery of the semiconductor memory device according to the embodiment.

Figure 30:
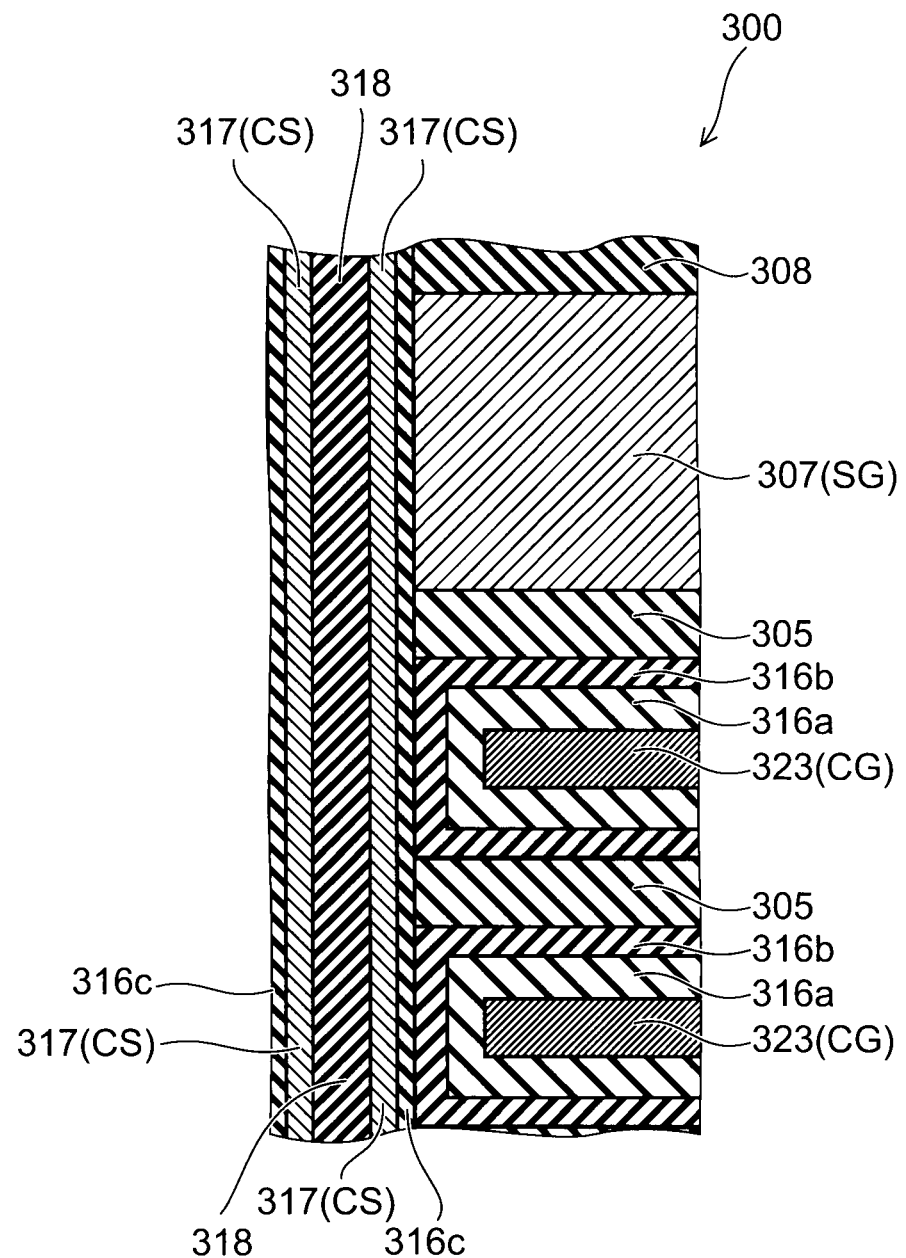
FIG. 30 is a cross-sectional view illustrating the memory cell periphery of the semiconductor memory device according to the third embodiment.

FIG. 30 is a cross-sectional view illustrating the memory cell periphery of the semiconductor memory device according to the embodiment.

First, using methods similar to those of the second embodiment described above as illustrated in FIG. 22, a silicon oxide film 302 and a phosphorus-doped polycrystalline silicon film 303 are formed on a silicon substrate 301; an excavation 303a is made in the upper surface of the phosphorus-doped polycrystalline silicon film 303; and a silicon-germanium film 304 is filled into the interior thereof.

Then, a silicon oxide film 305 made of non-doped silicon oxide is alternately deposited with a silicon nitride film 306 made of the silicon nitride on the entire surface by using PECVD. The silicon oxide film 305 is a film used to form the inter-electrode insulating film in the semiconductor memory device after completion; and the silicon nitride film 306 is a sacrificial insulating film removed in a subsequent process. For example, five layers of the silicon oxide film 305 and four layers of the silicon nitride film 306 are deposited in the embodiment.

Continuing, a boron-doped polycrystalline silicon film 307 is formed using LPCVD; and a silicon oxide film 308 and a silicon nitride film 309 are formed in this order using PECVD. Thereby, a stacked body 310 made of the silicon oxide film 305, the silicon nitride film 306, the boron-doped polycrystalline silicon film 307, the silicon oxide film 308, and the silicon nitride film 309 is formed on the phosphorus-doped polycrystalline silicon film 303, i.e., the back gate electrode BG.

Then, the resist pattern (not illustrated) is formed on the stacked body 310 to cover the memory cell region; and the stacked body 310 is patterned into a stairstep configuration at the end portion of the memory cell region by repeatedly executing RIE using the resist pattern as a mask and slimming the resist pattern. At this time, the upper surface of the silicon oxide film 305 at each of the levels of the stairstep is exposed. Subsequently, the stacked body 310 is buried by depositing a NSG film 311 on the entire surface; and the upper surface of the silicon nitride film 309 is exposed at the upper surface of the NSG film 311 by planarizing the upper surface.

Figure 23:
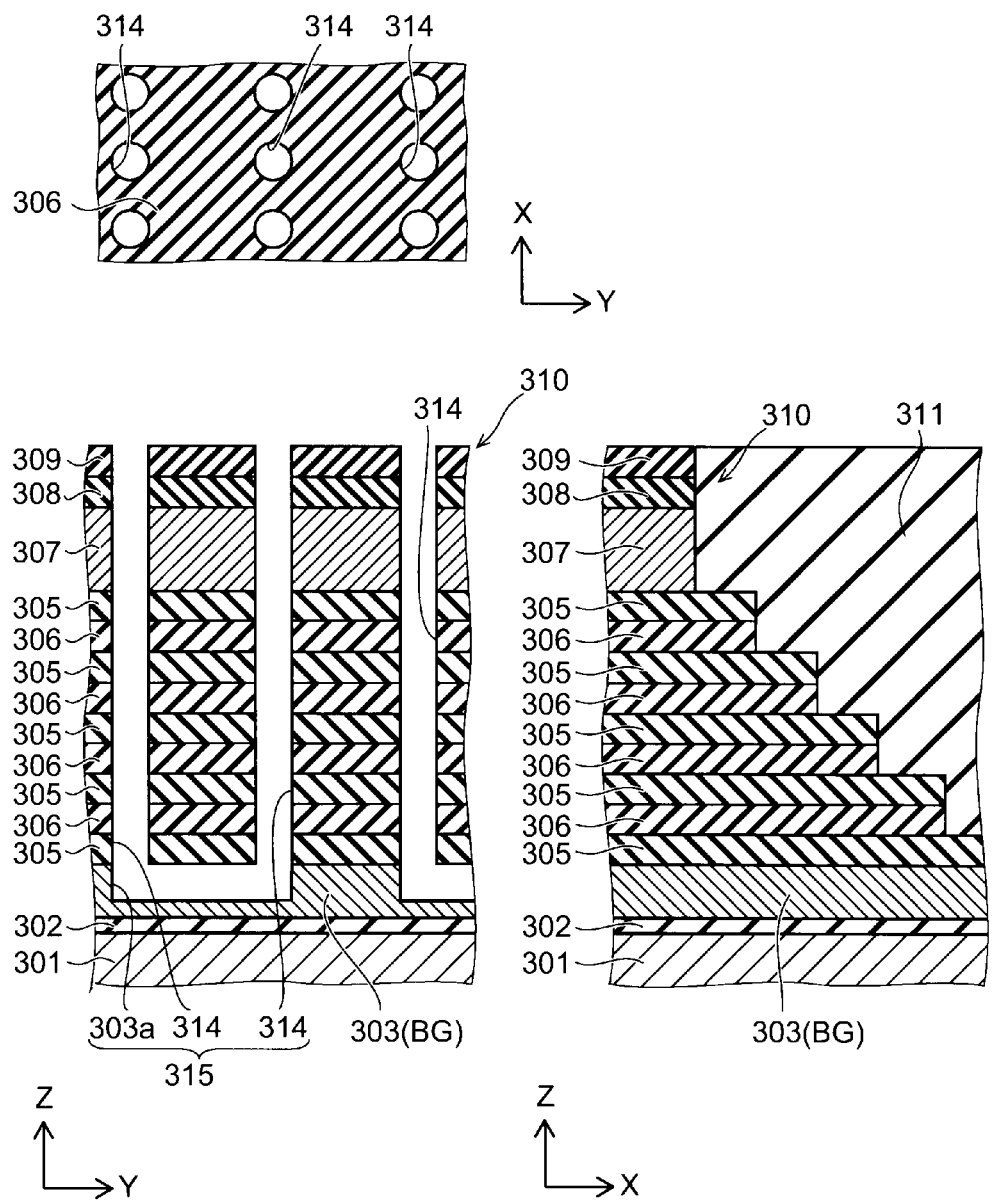

Continuing as illustrated in FIG. 23, a carbon film (not illustrated) is formed on the entire surface using PECVD and patterned using lithography and RIE. Then, the stacked body 310 is selectively removed by performing RIE using the patterned carbon film as a mask. Thereby, through-holes 314 extending in the Z direction are made in the stacked body 310. The through-holes 314 are arranged in a matrix configuration as viewed from the Z direction to reach both of the Y-direction end portions of the excavation 303a. Then, the silicon-germanium film 304 filled into the excavation 303a is removed via the through-holes 314 by performing dry etching using chlorine gas. Thereby, a U-shaped hole 315 is made in which two of the through-holes 314 connect with one of the excavations 303a. Subsequently, the carbon film is removed.

Figure 24:
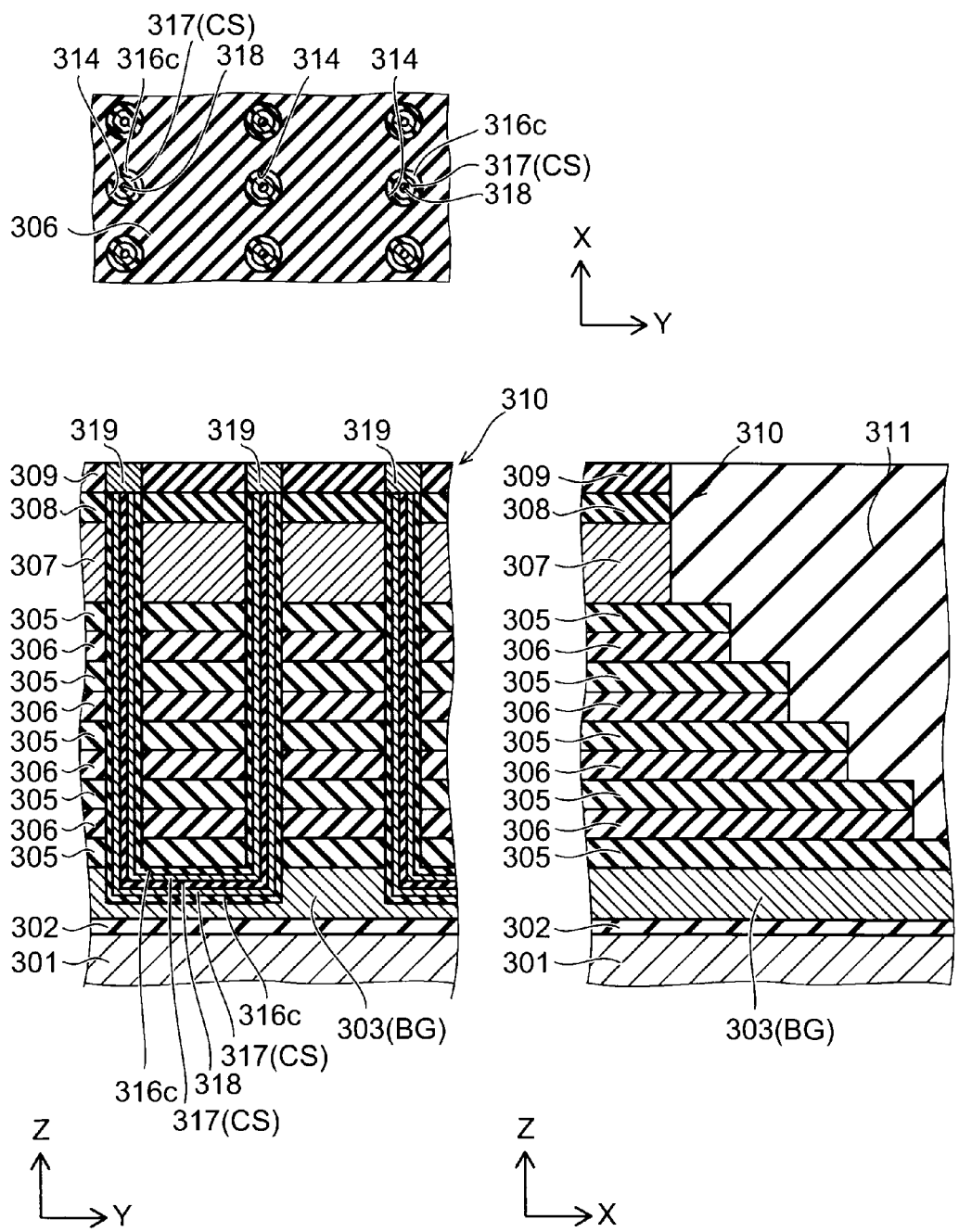

Then, as illustrated in FIG. 24, a tunneling dielectric film 316c is formed on the inner surface of the U-shaped hole 315 using ALD. The tunneling dielectric film 316c may be, for example, a silicon oxide film, a NO film, or an ONO film. Then, a boron-doped polycrystalline silicon-germanium film 317 is formed by depositing silicon-germanium on the tunneling dielectric film 316c. The boron-doped polycrystalline silicon-germanium film 317 is a film used to form the channel semiconductor CS. Crystallization is easier by using silicon-germanium as the material of the channel semiconductor CS. Then, silicon nitride 318 is filled into the remaining portion inside the U-shaped hole 315 using, for example, ALD. Thereby, the tunneling dielectric film 316c, the boron-doped polycrystalline silicon-germanium film 317, and the silicon nitride 318 are formed inside the U-shaped hole 315 in order from the outside.

Continuing, a recess is made in the upper portion of the U-shaped hole 315 by causing the tunneling dielectric film 316c, the boron-doped polycrystalline silicon-germanium film 317, and the silicon nitride 318 formed inside the U-shaped hole 315 to recede by performing RIE. Then, a polycrystalline silicon member 319 is filled into the recess. Continuing, the source region (not illustrated) and the drain region (not illustrated) are formed by introducing arsenic (As) to the polycrystalline silicon member 319 using lithography and ion implantation.

Figure 25:
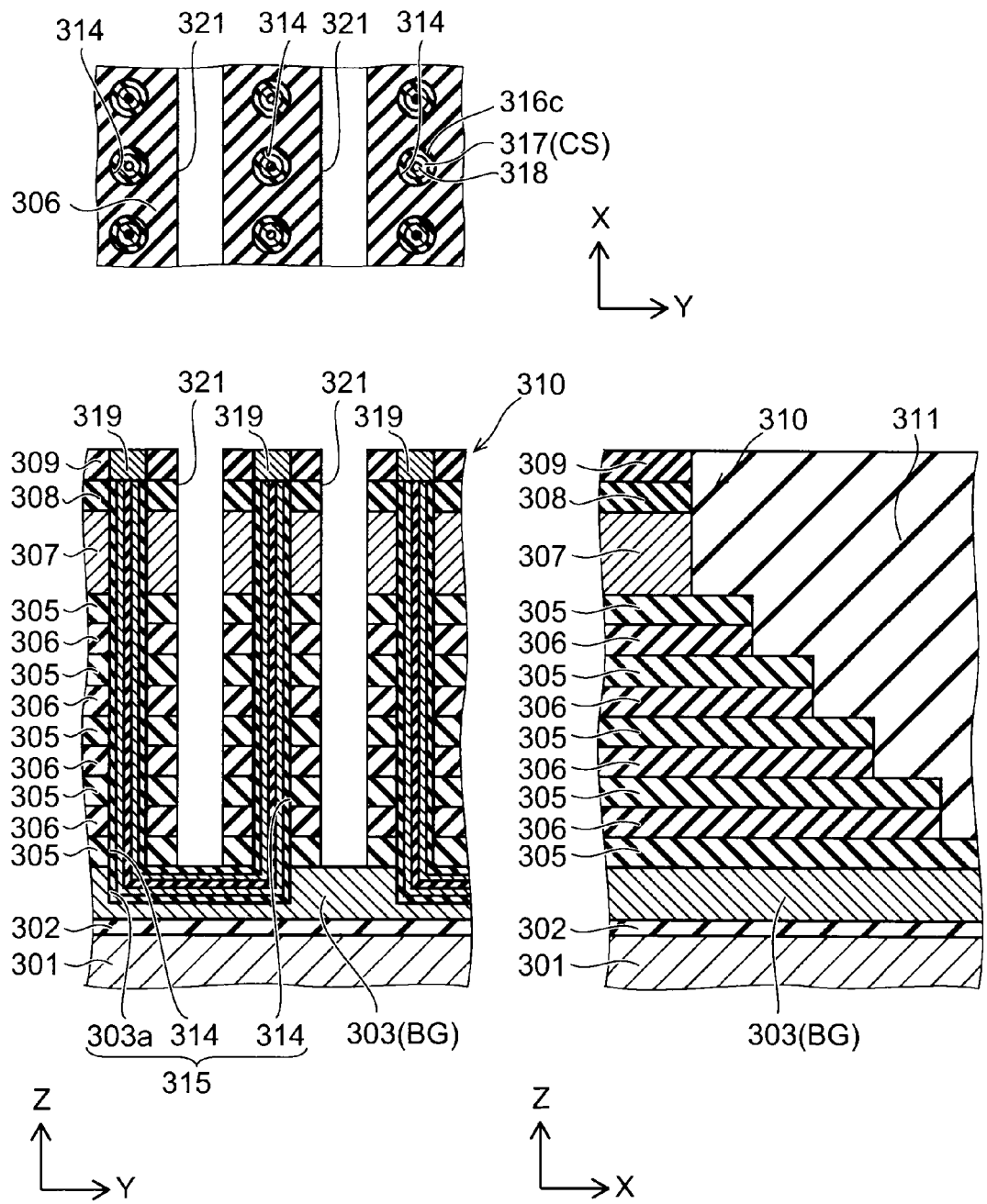

Then, as illustrated in FIG. 25, a carbon film (not illustrated) is formed on the entire surface using PECVD and patterned using lithography and RIE. Then, a trench 321 is made in the stacked body 310 by performing RIE using the patterned carbon film as a mask. The trench 321 is made to extend in the X direction between the through-holes 314 adjacent to each other in the Y direction. Subsequently, the carbon film is removed.

The stacked body 310 is subdivided into gate electrode configurations as viewed from the Z direction by making the trench 321. In such a case, it is difficult to reduce the distance between the through-holes 314 mutually adjacent in the bit line direction (the Y direction) because it is necessary to make a relatively-wide trench 321 between the through-holes 314. However, because the silicon nitride films 306 can be replaced from both of the Y-direction sides when replacing the silicon nitride films 306 with the control gate electrodes CG in a subsequent process, it is unnecessary to make a trench between the through-holes 314 mutually adjacent in the word line direction (the X direction). Therefore, it is easy to reduce the distance between the through-holes 314 in the X direction.

Figure 26:
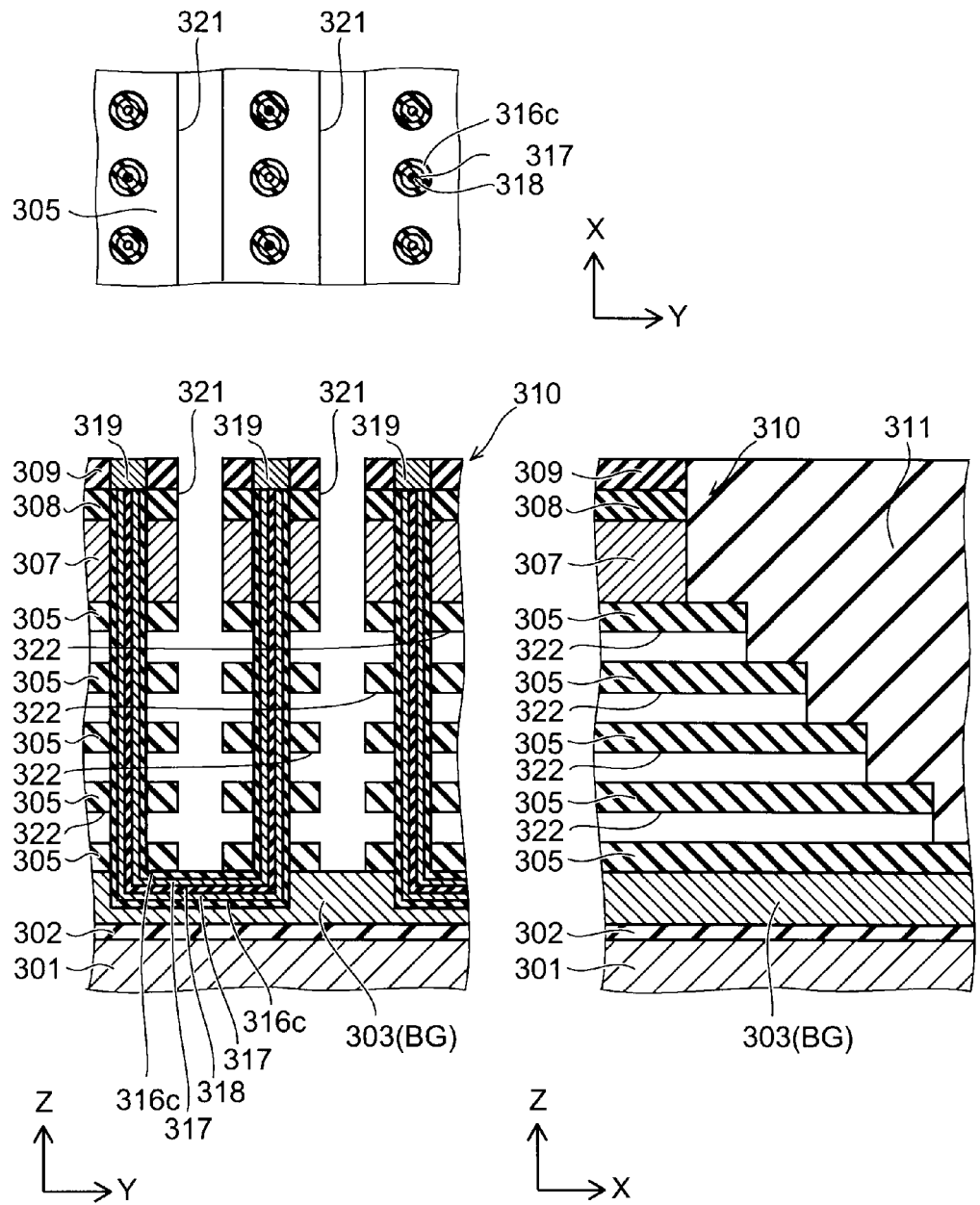

Then, as illustrated in FIG. 26, wet etching is performed using hot phosphoric acid. Thereby, the silicon nitride films 306 (referring to FIG. 21) are removed via the trench 321. At this time, the other films, e.g., the silicon oxide films 305, the tunneling dielectric film 316c, etc., substantially are not removed. As a result, a cavity 322 forms in the portion where the silicon nitride films 306 were formed. The cavity 322 is a space that forms a mold of the control gate electrodes in a subsequent process.

Figure 27:
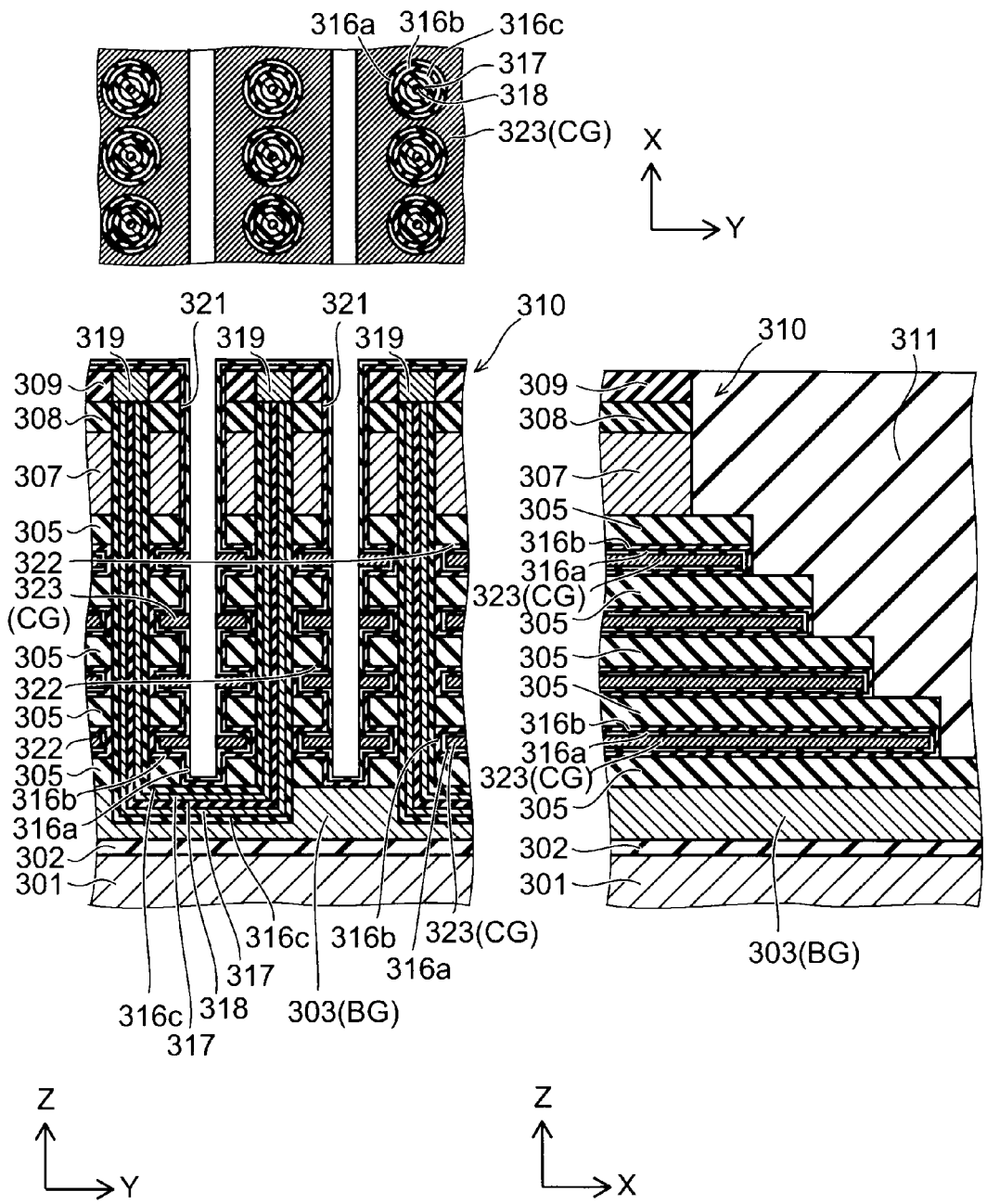

Continuing as illustrated in FIG. 27, the tunneling dielectric film 316c is modified by performing dry oxidation. Then, a charge trap film 316b and a charge blocking film 316a are formed in this order on the inner surface of the trench 321 and the upper surface of the stacked body 310 using ALD or CVD. For example, a film in which a hafnia layer is interposed between silicon nitride layers may be formed as the charge trap film 316b. An alumina film may be formed as the charge blocking film 316a.

Then, tantalum nitride (TaN) is deposited using ALD; and then tungsten (W) is deposited using CVD. Thereby, a TaN/W stacked film 323 is formed on the entire surface. The TaN/W stacked film 323 is formed also inside the cavity 322. Subsequently, etch-back is performed using gaseous etching using $ClF_3$ gas. Thereby, the TaN/W stacked film 323 remains only inside the cavity 322 to form the control gate electrodes CG.

The subsequent processes are similar to those of the first embodiment described above. Namely, as illustrated in FIG. 28, a silicon oxide film 324 is formed on the entire surface by performing CVD using TEOS and ozone ($O_3$) as the source materials; and the upper surface is planarized. At this time, the silicon oxide film 324 is filled also inside the trench 321. Then, contact holes are made in the silicon oxide film 324 in the region directly above a polycrystalline silicon member 320 and in the region directly above each of the levels of the stairstep; and tungsten (W) is filled using CVD. Thereby, contact plugs 325 connected to the polycrystalline silicon member 320 and the control gate electrode CG are formed. Then, a source line 326, an inter-layer insulating film 327, a contact plug 328, a bit line 329, an inter-layer insulating film 330, an upper layer interconnect 331, and an inter-layer insulating film 332 are formed on the silicon oxide film 324. Thus, the semiconductor memory device 300 is manufactured.

In the semiconductor memory device 300 thus manufactured as illustrated in FIG. 28, FIG. 29, and FIG. 30, the charge trap film 316b is formed on the inner surface of the cavity 322 made by removing the silicon nitride film 306. Therefore, the charge trap film 316b has a configuration provided around the control gate electrode CG to be folded back in a direction away from the channel semiconductor CS between the memory cells.

Effects of the embodiment will now be described.

According to the embodiment, the charge trap film 316b extends in a direction orthogonal to the direction (the Z direction) in which the channel semiconductor CS extends in the regions between the control gate electrodes CG. Therefore, charge does not easily move through the charge trap film 316b between memory cells that share the channel semiconductor CS. As a result, the occurrence of program disturbance can be suppressed; and the degradation of the data retention can be prevented.

In the embodiment, only the tunneling dielectric film 316c is interposed between the selection gate electrode SG and the channel semiconductor CS; and the charge trap film 316b is not interposed. Therefore, the threshold value of the selection gate transistor does not fluctuate easily; and the operations are stabilized.

Also, in the embodiment, the NAND semiconductor memory device 300 can be manufactured by processes similar to the manufacturing processes of DRAM (Dynamic Random Access Memory). The effects thereof will now be described specifically by comparing the manufacturing processes of the semiconductor memory device 300 to general DRAM manufacturing processes.

FIG. 31 schematically illustrates the manufacturing processes of the semiconductor memory device according to the embodiment and the general DRAM manufacturing processes.

First, as illustrated in step S1 of FIG. 31, transistors are formed in a semiconductor substrate. Specifically, in the embodiment, the transistors of the peripheral circuit (not illustrated) are formed in the upper surface of the silicon substrate. On the other hand, in the DRAM manufacturing processes, the transistors of the cell circuit (not illustrated) are formed in the upper surface of the silicon substrate (not illustrated).

Then, as illustrated in step S2, a PMD (Pre-Metal Dielectric) is formed. Specifically, in the embodiment, the phosphorus-doped polycrystalline silicon film 303 is formed on the silicon substrate, as a back gate electrode; a recess is made in the upper surface thereof; and the silicon-germanium film 304 is filled into the recess as a sacrificial film. Then, the silicon oxide film 302 is formed. On the other hand, in the DRAM manufacturing processes, a silicon oxide film 900 is formed on the silicon substrate. In the case of DRAM, a contact plug 901 that connects with the transistor of the cell circuit is formed.

Continuing as illustrated in step S3, ILDs (Inter Layer Dielectrics, i.e., inter-layer insulating films) are formed. Specifically, in the embodiment, the stacked body 310 made of the silicon oxide films 305 and the silicon nitride films 306 is formed. The total thickness of the stacked body 310 is, for example, 1 μm to 3 μm. On the other hand, in the DRAM manufacturing processes, a thin silicon nitride film 902 and a thick BPSG film 910 are formed. The thickness of the BPSG film 910 generally is 1 μm to 2 μm.

Then, as illustrated in step S4, a through-hole is made. Specifically, in the embodiment, the through-hole 314 is made in the stacked body 310 and the silicon oxide film 302; and the sacrificial film 301 is removed. On the other hand, in the DRAM manufacturing processes, a memory hole 914 that connects with the contact plug 901 is made in the BPSG film 910 and the silicon nitride film 902.

Continuing as illustrated in step S5, a prescribed material is filled into the through-hole. Specifically, in the embodiment, the tunneling dielectric film 316c (not illustrated) and the channel semiconductor CS are filled into the through-hole 314. On the other hand, in the DRAM manufacturing processes, a SN electrode (storage node electrode) 915 is filled into the memory hole 914.

Then, as illustrated in step S6, a trench is made. Specifically, in the embodiment, the trench 321 is made in the stacked body 310. Although there is no corresponding process in the DRAM manufacturing processes, the impact of the formation of the trench 321 is low because the trench 321 may be made by normal lithography and RIE.

Continuing as illustrated in step S7, the sacrificial film is removed. Specifically, in the embodiment, the silicon nitride film 306 is removed. On the other hand, in the DRAM manufacturing processes, the BPSG film 910 is removed.

Then, as illustrated in step S8, a dielectric film is formed. Specifically, in the embodiment, the charge trap film 316b (not illustrated) and the charge blocking film 316a are formed on the inner surface of the cavity 322 made by removing the silicon nitride film 306. On the other hand, in the DRAM manufacturing processes, a capacitance film 916 is formed to cover the SN electrode 915.

Continuing as illustrated in step S9, electrodes are formed. Specifically, in the embodiment, the control gate electrodes CG are formed by filling the TaN/W stacked film 323 into the cavity 322. On the other hand, in the DRAM manufacturing processes, a PL electrode 920 is formed to bury the SN electrode 915 covered with the capacitance film 916.

Thus, the semiconductor memory device 300 according to the embodiment can be manufactured by a combination of substantially the same processes as the DRAM manufacturing processes. Therefore, the semiconductor memory device 300 can be manufactured relatively easily in a normal DRAM manufacturing line. In other words, a semiconductor memory device having an exceedingly high bit density can be manufactured by effectively using the manufacturing technology of DRAM. Otherwise, the manufacturing method, the configuration, and the effects of the embodiment are similar to those of the first embodiment described above.

The embodiments and the modifications thereof described above can be implemented in combination with each other. The film configurations and the formation methods of the inter-electrode insulating film and the sacrificial insulating film, the film configurations and the patterning methods of the memory film, etc., are not limited to the combinations illustrated in the embodiments described above; and any combination is possible to the extent that the spirit of the invention is not departed from. The channel semiconductor may include, for example, a polycrystalline silicon film crystallized using laser annealing or nickel (Ni) catalyzation, a monocrystalline silicon film, silicon including a hetero element such as germanium (Ge), or a semiconductor material other than silicon. The configuration of the channel semiconductor may have a configuration other than a tubular configuration and may be filled to the center. In such a case, the process of filling the insulator into the hollow portion of the channel semiconductor can be omitted.

The charge blocking film may include a silicon oxide film, an ONO film, a metal oxide film made of a metal oxide such as $Al_2O_3$, $HfO_2$, $La_2O_3$, $Pr_2O_3$, $Y_2O_3$, $ZrO_2$, etc., or a film that multiply combines such metal oxide films. The control gate electrode may include titanium nitride (TiN), polycrystalline silicon, a silicide such as WSi, CoSi, NiSi, PrSi, NiPtSi, PtSi, etc., formed by siliciding a polycrystalline silicon film, a metal such as Pt or Ru, or a metal oxide such as $RuO_2$. Although an example is illustrated in the embodiments described above in which the number of stacks of the control gate electrode CG is four layers, the number of stacks of the control gate electrode CG may be three or fewer layers or five or more layers, e.g., ten or more layers.

Although an example is illustrated in the embodiments and the modifications thereof described above in which two through-holes connect with an excavation made in the back gate electrode such that the configuration of the channel semiconductor is U-shaped, this is not limited thereto. An I-shaped channel semiconductor may be formed without the two through-holes communicating with each other. In such a case, the lower end of the channel semiconductor is connected to a source layer formed in the silicon substrate.

Although an example is illustrated in the embodiments and the modifications thereof described above in which the memory cell unit and the peripheral circuit unit are set separately in the silicon substrate, this is not limited thereto. For example, the memory cells may be formed in the region directly above the peripheral circuit. In such a case, the peripheral circuit and the memory cells can be connected via multiple layer interconnects. Thereby, the bit density of the entire semiconductor memory device can be increased further. In such a case, it is sufficient to connect the upper end portions of the channel semiconductors with a phosphorus-doped polycrystalline silicon film, etc.

According to the embodiments described above, a method for manufacturing a semiconductor memory device that is easy to manufacture can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor memory device, comprising:
   forming a stacked body on a substrate by alternately stacking a first insulating film and a second insulating film;
   making a through-hole extending in a stacking direction of the first insulating film and the second insulating film to pierce the stacked body;
   forming at least a portion of a blocking insulating film, a charge trap film, and a tunneling dielectric film of a MONOS on an inner surface of the through-hole;
   forming a channel semiconductor on the tunneling dielectric film;
   making a trench in the stacked body;
   removing the second insulating film by performing etching via the trench; and
   filling a conductive material into a space made by the removing of the second insulating film.

2. The method according to claim 1, further comprising forming a conductive film on the stacked body,
   the through-hole also piercing the conductive film in the making of the through-hole,
   the conductive film being divided by the trench in the making of the trench.

3. The method according to claim 1, further comprising:
   forming a third insulating film on the stacked body;
   making an opening in the third insulating film; and
   filling a fourth insulating film into an interior of the opening,
   the through-hole being made inside the opening in the making of the through-hole,
   the fourth insulating film also being removed in the removing of the second insulating film,
   the conductive material also being filled into a space made by the removing of the fourth insulating film in the filling of the conductive material.

4. The method according to claim 1, further comprising:
   forming a back gate electrode on the substrate;
   making an excavation in an upper surface of the back gate electrode;
   filling a first material into the excavation; and
   removing the first material via the through-hole,
   two of the through-holes being caused to reach two end portions of the excavation respectively in the making of the through-hole,
   the blocking insulating film, the charge trap film, and the tunneling dielectric film being formed also on an inner surface of the excavation in the forming of the blocking insulating film, the charge trap film, and the tunneling dielectric film,
   the channel semiconductor also being filled into the excavation in the forming of the channel semiconductor.

5. The method according to claim 4, further comprising:
   making one other trench in the stacked body in a region directly above the excavation; and
   filling an insulating material into the one other trench, the one other trench filled with the insulating material being interposed between the through-holes.

6. The method according to claim 1, wherein the conductive material is a metal or a metal nitride.

7. The method according to claim 1, wherein
   the first insulating film is formed of non-doped silicon oxide, and
   the second insulating film is formed of silicon oxide doped with at least boron.

8. The method according to claim 1, wherein
   the first insulating film is formed of silicon oxide, and
   the second insulating film is formed of silicon nitride.

9. The method according to claim 1, wherein the forming of the channel semiconductor includes depositing a semiconductor material in a tubular configuration on the inner surface of the through-hole.

10. A method for manufacturing a semiconductor memory device, comprising:
    forming a stacked body on a substrate by alternately stacking a first insulating film and a second insulating film;
    making a through-hole extending in a stacking direction of the first insulating film and the second insulating film to pierce the stacked body;
    forming a tunneling dielectric film on an inner surface of the through-hole;
    forming a channel semiconductor on the tunneling dielectric film;
    making a trench in the stacked body;
    removing the second insulating film by performing etching via the trench;
    depositing a charge trap film and a charge blocking film in this order on an inner surface of a space made by the removing of the second insulating film; and
    filling a conductive material into the space.

11. The method according to claim 10, further comprising forming a conductive film on the stacked body,
    the through-hole also piercing the conductive film in the making of the through-hole,
    the conductive film being divided by the trench in the making of the trench.

12. The method according to claim 10, further comprising:
    forming a back gate electrode on the substrate;
    making an excavation in an upper surface of the back gate electrode;
    filling a first material into the excavation; and
    removing the first material via the through-hole,
    two of the through-holes being caused to reach two end portions of the excavation respectively in the making of the through-hole,
    the tunneling dielectric film being formed also on an inner surface of the excavation in the forming of the tunneling dielectric film,
    the channel semiconductor also being filled into the excavation in the forming of the channel semiconductor.

13. The method according to claim 12, wherein the trench is made in the stacked body in both a region directly above a region between the excavations and a region directly above a central portion of the excavation.

* * * * *